US012690217B2

(12) United States Patent
Chikamatsu

(10) Patent No.: US 12,690,217 B2
(45) Date of Patent: Jul. 21, 2026

(54) GROUP III NITRIDE SEMICONDUCTOR DEVICE WITH FIRST AND SECOND CONDUCTIVE LAYERS

(71) Applicant: ROHM CO., LTD., Kyoto (JP)

(72) Inventor: Kentaro Chikamatsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1086 days.

(21) Appl. No.: 17/575,863

(22) Filed: Jan. 14, 2022

(65) Prior Publication Data

US 2022/0140122 A1 May 5, 2022

Related U.S. Application Data

(63) Continuation of application No. 16/884,939, filed on May 27, 2020, now Pat. No. 11,257,938, which is a
(Continued)

(30) Foreign Application Priority Data

Nov. 2, 2017 (JP) ................................. 2017-213022
Oct. 26, 2018 (JP) ................................. 2018-201619

(51) Int. Cl.
*H10D 30/47* (2025.01)
*H10D 30/01* (2025.01)
(Continued)

(52) U.S. Cl.
CPC ........... *H10D 30/47* (2025.01); *H10D 30/015* (2025.01); *H10D 30/475* (2025.01);
(Continued)

(58) Field of Classification Search
CPC ..... H10D 64/112; H10D 30/47; H10D 30/471
See application file for complete search history.

(56) References Cited

U.S. PATENT DOCUMENTS 8,853,666 B2 10/2014 Inoue et al.
9,048,303 B1 6/2015 Ostermaier et al.
(Continued)

FOREIGN PATENT DOCUMENTS

JP 2007537593 12/2007
JP 2008124440 5/2008
(Continued)

OTHER PUBLICATIONS

Notice of Reasons for Refusal issued for Japanese Patent Application No. 2022-166319, Dispatch Date: Oct. 19, 2023, 7 pages including English machine translation.
(Continued)

*Primary Examiner* — Matthew C Landau
(74) *Attorney, Agent, or Firm* — HSML P.C.

(57) ABSTRACT

A semiconductor device is provided with, a group-III nitride semiconductor layered structure that includes a heterojunction, an insulating layer which has a gate opening that reaches the group-III nitride semiconductor layered structure and which is disposed on the group-III nitride semiconductor layered structure, a gate insulating film that covers the bottom and the side of the gate opening, a gate electrode defined on the gate insulating film inside the gate opening, a source electrode and a drain electrode which are disposed to be spaced apart from the gate electrode so as to sandwich the gate electrode, a first conductive layer embedded in the insulating layer between the gate electrode and the drain electrode, and a second conductive layer that is embedded in the insulating layer above the first conductive layer in a region closer to the drain electrode side than the first conductive layer.

19 Claims, 27 Drawing Sheets

1

Related U.S. Application Data continuation of application No. 16/178,289, filed on Nov. 1, 2018, now Pat. No. 10,700,188.

(51) Int. Cl.

| | |
|---|---|
| *H10D 62/10* | (2025.01) |
| *H10D 62/824* | (2025.01) |
| *H10D 62/85* | (2025.01) |
| *H10D 64/00* | (2025.01) |
| *H10D 64/23* | (2025.01) |
| *H10D 64/27* | (2025.01) |
| *H10D 64/68* | (2025.01) |

(52) U.S. Cl.

CPC ....... *H10D 62/105* (2025.01); *H10D 62/8503* (2025.01); *H10D 64/112* (2025.01); *H10D 64/251* (2025.01); *H10D 62/824* (2025.01); *H10D 64/513* (2025.01); *H10D 64/685* (2025.01); *H10D 64/693* (2025.01)

(56) References Cited

U.S. PATENT DOCUMENTS

| | | | | |
|---|---|---|---|---|
| 9,741,840 | B1 * | 8/2017 | Moens | ................ H01L 21/8252 |
| 9,812,534 | B2 | 11/2017 | Zhang et al. | |
| 10,529,821 | B2 | 1/2020 | Huang | |
| 10,700,188 | B2 * | 6/2020 | Chikamatsu | ........ H01L 29/2003 |
| 10,749,005 | B1 | 8/2020 | Pei et al. | |
| 2005/0253168 | A1 | 11/2005 | Wu et al. | |
| 2006/0006415 | A1 | 1/2006 | Wu et al. | |
| 2008/0116492 | A1 | 5/2008 | Wu et al. | |
| 2008/0128752 | A1 | 6/2008 | Wu | |
| 2009/0045438 | A1 | 2/2009 | Inoue et al. | |
| 2010/0025730 | A1 | 2/2010 | Heikman et al. | |
| 2012/0280280 | A1 | 11/2012 | Zhang | |
| 2013/0134435 | A1 | 5/2013 | Yu et al. | |
| 2013/0161638 | A1 | 6/2013 | Yao et al. | |
| 2014/0061659 | A1 | 3/2014 | Teplik et al. | |
| 2014/0264360 | A1 | 9/2014 | Huang et al. | |
| 2014/0264369 | A1 | 9/2014 | Padmanabhan et al. | |
| 2015/0279982 | A1 | 10/2015 | Yamamoto et al. | |
| 2015/0357422 | A1 * | 12/2015 | Liao | ..................... H10D 64/111 |
| | | | | 438/172 |
| 2016/0380062 | A1 | 12/2016 | Zhang et al. | |
| 2017/0170284 | A1 | 6/2017 | Li et al. | |
| 2018/0033669 | A1 * | 2/2018 | Salih | ..................... H01L 29/404 |
| 2018/0061902 | A1 | 3/2018 | Lee et al. | |
| 2019/0096879 | A1 | 3/2019 | Chen et al. | |
| 2019/0280092 | A1 * | 9/2019 | Lin et al. | |
| 2020/0083360 | A1 | 3/2020 | Hafez et al. | |
| 2020/0091285 | A1 | 3/2020 | Hafez et al. | |
| 2020/0219772 | A1 | 7/2020 | Ramaswamy et al. | |

FOREIGN PATENT DOCUMENTS

| | | |
|---|---|---|
| JP | 2008131031 | 6/2008 |
| JP | 2008277604 | 11/2008 |
| JP | 2014045146 A | 3/2014 |
| JP | 2015170821 | 9/2015 |
| JP | 2016134599 | 7/2016 |
| JP | 2017123432 | 7/2017 |
| WO | 2012043334 A1 | 4/2012 |

OTHER PUBLICATIONS

Notice of Reasons for Refusal issued for Japanese Patent Application No. 2022-166319, Dispatch Date: Mar. 14, 2024, 3 pages including English machine translation.

Notice of Reasons for Refusal issued for Japanese Patent Application No. 2018-201619, Dispatch Date: Jun. 2, 2022, 10 pages including English machine translation.

Notice of Reasons for Refusal issued for Japanese Patent Application No. 2018-201619, Dispatch Date: Sep. 1, 2022, 3 pages including English machine translation.

* cited by examiner

GROUP III NITRIDE SEMICONDUCTOR DEVICE WITH FIRST AND SECOND CONDUCTIVE LAYERS

CROSS-REFERENCE TO RELATED APPLICATIONS

This application is a Continuation application of U.S. application Ser. No. 16/884,939 filed in the U.S. Patent and Trademark Office on May 27, 2020, which is a Continuation application of U.S. application Ser. No. 16/178,289, filed in the U.S. Patent and Trademark Office on Nov. 1, 2018, which was issued as U.S. Pat. No. 10,700,188, on Jun. 30, 2020, and which is related to Japanese Patent Application No. 2017-213022 filed with Japan Patent Office on Nov. 2, 2017, and Japanese Patent Application No. 2018-201619 filed with Japan Patent Office on Oct. 26, 2018, which are herein incorporated by reference in their entirety.

TECHNICAL FIELD

The present invention relates to semiconductor devices having a high electron mobility transistor (HEMT).

BACKGROUND ART

Conventionally, it is known that the HEMT having the metal insulator semiconductor (MIS) structure has a gate field plate that is defined integrally with a gate electrode in order to alleviate the concentration of an electric field on an end of the gate electrode. On the other hand, as another technique for alleviating the electric field concentration, it is proposed to define a source field plate on a side of the gate electrode, the source field plate being electrically connected to the source electrode.

SUMMARY OF INVENTION

A preferred embodiment of the present invention provides a semiconductor device which is capable of alleviating, as compared with a conventional technique, the concentration of an electric field on each end of a gate electrode and a conductive layer (source field plate). A semiconductor device according to a preferred embodiment of the present invention is provided with, a group-III nitride semiconductor layered structure that includes a heterojunction, an insulating layer which has a gate opening that reaches the group-III nitride semiconductor layered structure and which is disposed on the group-III nitride semiconductor layered structure, a gate insulating film that covers the bottom and the side of the gate opening, a gate electrode defined on the gate insulating film inside the gate opening, a source electrode and a drain electrode which are disposed to be spaced apart from the gate electrode such that the source electrode and the drain electrode sandwich the gate electrode and each of which are electrically connected to the group-III nitride semiconductor layered structure, a first conductive layer embedded in the insulating layer between the gate electrode and the drain electrode and electrically connected to the source electrode, and a second conductive layer that is embedded in the insulating layer above the first conductive layer in a region closer to the drain electrode side than the first conductive layer and electrically connected to the source electrode.

According to this arrangement, the second conductive layer electrically connected to the source electrode is embedded in the insulating layer in a region closer to the drain electrode side than the first conductive layer. That is, the second conductive layer does not overlap the upper region of the gate electrode but is disposed below the top of the gate electrode on the side of the gate electrode. This makes it possible to alleviate the strength of electric field concentration between the gate and the drain. As a result, it is possible to provide a semiconductor device which is capable of improving the withstand voltage and the leakage property.

A semiconductor device according to a preferred embodiment of the present invention may be adapted such that the second conductive layer may have an end toward the gate electrode side that opposes the first conductive layer with part of the insulating layer sandwiched between the end and the first conductive layer in the thickness direction of the insulating layer.

A semiconductor device according to a preferred embodiment of the present invention may further include a third conductive layer which is disposed above the insulating layer in a region closer to the drain electrode side than the second conductive layer and electrically connected to the source electrode.

A semiconductor device according to a preferred embodiment of the present invention may further include a third conductive layer which is embedded in the insulating layer above the second conductive layer in a region closer to the drain electrode side than the second conductive layer and electrically connected to the source electrode.

Providing the third conductive layer makes it possible to further alleviate the strength of electric field concentration between the gate and the drain.

A semiconductor device according to a preferred embodiment of the present invention may be adapted such that the third conductive layer may have an end toward the gate electrode side which opposes the second conductive layer with part of the insulating layer sandwiched between the end and the second conductive layer in the thickness direction of the insulating layer.

A semiconductor device according to a preferred embodiment of the present invention may be adapted such that the insulating layer immediately below the third conductive layer may have a thickness of 150 nm to 250 nm.

A semiconductor device according to a preferred embodiment of the present invention may be adapted such that the gate electrode may include an overlap portion which is defined above the insulating layer such that the overlap portion opposes the end of the first conductive layer toward the gate electrode side with part of the insulating layer sandwiched between the overlap portion and the end of the first conductive layer in the thickness direction of the insulating layer.

According to this arrangement, this makes it possible to reduce the capacitance (the gate-drain capacitance Cgd) between the two-dimensional electron gas electrically connected to the drain electrode and the gate electrode. As a result, since the parasitic capacitance of the semiconductor device is reduced, the high-speed switching operation and the high-frequency operation, etc., that are the features of the nitride semiconductor device can be excellently utilized.

A semiconductor device according to a preferred embodiment of the present invention may be adapted such that the insulating layer may include a first insulating layer supporting the first conductive layer, a second insulating layer covering the first conductive layer and supporting the second conductive layer, and a third insulating layer covering the second conductive layer. The first insulating layer may be formed of a SiN layer.

According to this arrangement, this makes it possible to reduce the strength of an electric field applied on the end of the first conductive layer toward the drain electrode side when compared with the case where a $SiO_2$ layer is employed as the first insulating layer.

A semiconductor device according to a preferred embodiment of the present invention may be adapted such that the SiN layer may have a thickness of 30 nm to 80 nm.

A semiconductor device according to a preferred embodiment of the present invention may be adapted such that a two-dimensional electron gas defined in the heterojunction of the group-III nitride semiconductor layered structure may have a concentration of $0.5 \times 10^{13}$ cm$^{-2}$ to $1.0 \times 10^{13}$ cm$^{-2}$.

A semiconductor device according to a preferred embodiment of the present invention may further include an insulating side wall which is disposed between the gate insulating film and the side of the gate opening.

According to this arrangement, this makes it possible to control the distance between the gate electrode and the first conductive layer by the thickness of the side wall. It is thus possible to design the thickness of the gate insulating film mainly according to the intended gate threshold voltage.

A semiconductor device according to a preferred embodiment of the present invention may be adapted such that the side wall may include at least one type of material selected from the group consisting of $SiO_2$, SiN, and SiON.

A semiconductor device according to a preferred embodiment of the present invention may be adapted such that the distance $L_{GF1}$ between the gate electrode and the first conductive layer may be 1 μm or less.

A semiconductor device according to a preferred embodiment of the present invention may be adapted such that the gate insulating film may include at least one type of material selected from the group consisting of Si, Al and Hf as a component element.

A semiconductor device according to a preferred embodiment of the present invention may be adapted such that the gate electrode may include a metal electrode.

A semiconductor device according to a preferred embodiment of the present invention may be adapted such that the group-III nitride semiconductor layered structure includes an active region which includes an element structure arranged by sandwiching the gate electrode between the source electrode and the drain electrode, and a nonactive region outside the active region, the source electrode, the first conductive layer, and the second conductive layer each include an extension to the nonactive region, and the extension of the source electrode is connected to the extensions of the first conductive layer and the second conductive layer.

According to this arrangement, this eliminates the need for providing the active region with a conductive structure that is electrically connected to, respectively, the source electrode and each conductive layer over the gate electrode as a structure to electrically connect the source electrode to the first conductive layer and the second conductive layer. Such a conductive structure provided in the active region may cause an increase in the parasitic capacitance of the semiconductor device. However, as described above, connecting between the source electrode and each conductive layer in the nonactive region can prevent an increase in parasitic capacitance.

A semiconductor device according to a preferred embodiment of the present invention may be adapted such that the group-III nitride semiconductor layered structure may include a first semiconductor layer and a second semiconductor layer on the first semiconductor layer that define the heterojunction, and the second semiconductor layer may include an oxide film selectively defined by oxidizing the second semiconductor layer on the bottom of the gate opening.

According to this arrangement, this makes it possible to reduce the two-dimensional electron gas immediately below the gate electrode and thus, achieve a normally OFF type HEMT.

A semiconductor device according to a preferred embodiment of the present invention may be adapted such that the group-III nitride semiconductor layered structure may include a first semiconductor layer and a second semiconductor layer on the first semiconductor layer that define the heterojunction, and the second semiconductor layer may be selectively etched only on the bottom of the gate opening.

According to this arrangement, this prevents the formation of the heterojunction immediately below the gate electrode by the recess structure provided by etching. In this manner, the normally OFF type HEMT can be achieved because no two-dimensional electron gas is defined in the region immediately below the gate electrode when no gate bias is applied (at the time of zero bias).

A semiconductor device according to a preferred embodiment of the present invention may further include a floating conductive layer which is embedded in the insulating layer between the gate electrode and the source electrode, the floating conductive layer being insulated from the gate electrode by the gate insulating film and also insulated from the source electrode.

DESCRIPTION OF EMBODIMENTS

Now, the preferred embodiments of the present invention will be described in more detail with reference to the attached drawings.

Figure 1A:
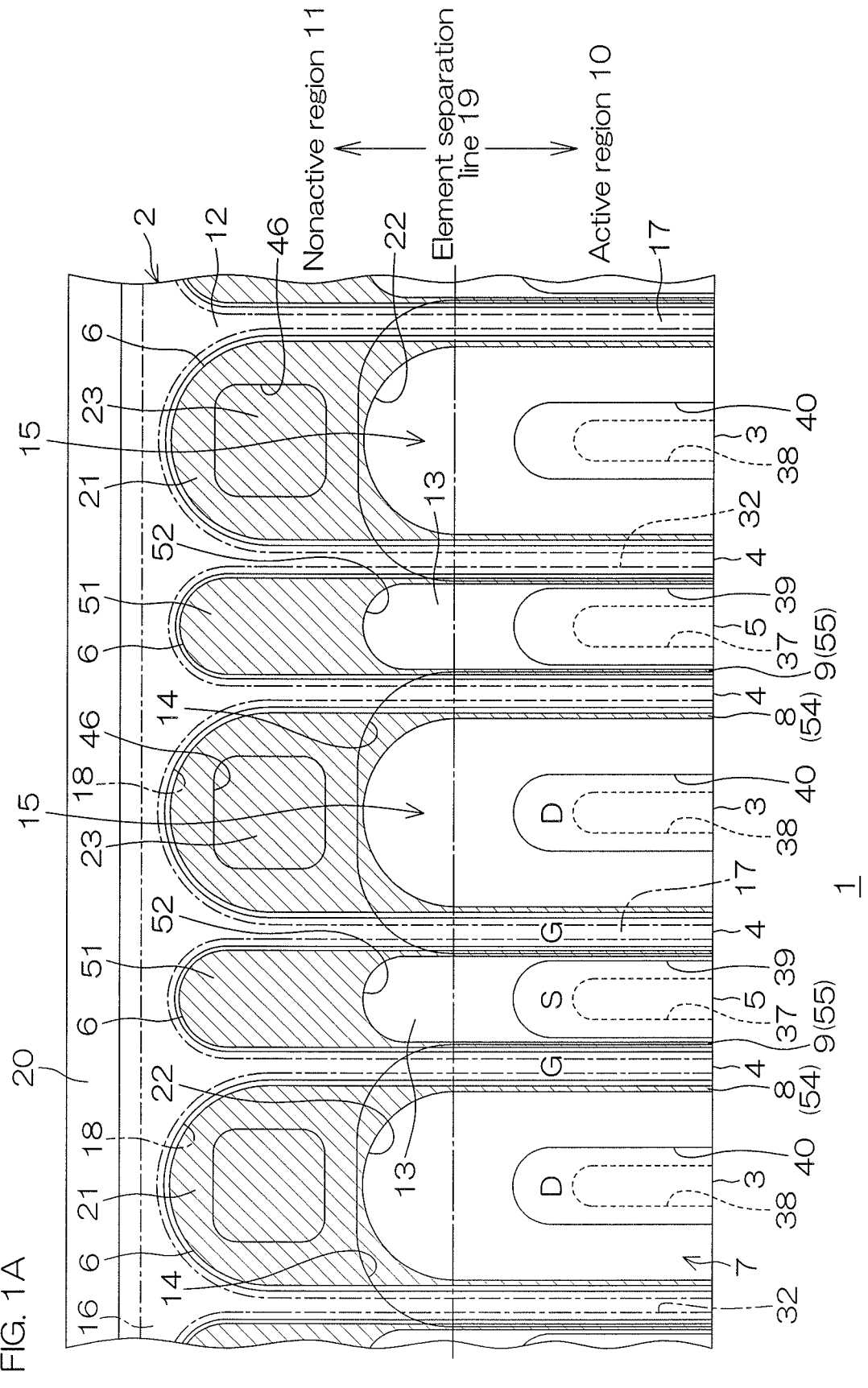
FIG. 1A is a schematic plan view illustrating a semiconductor device according to a preferred embodiment of the present invention.
Figure 1B:
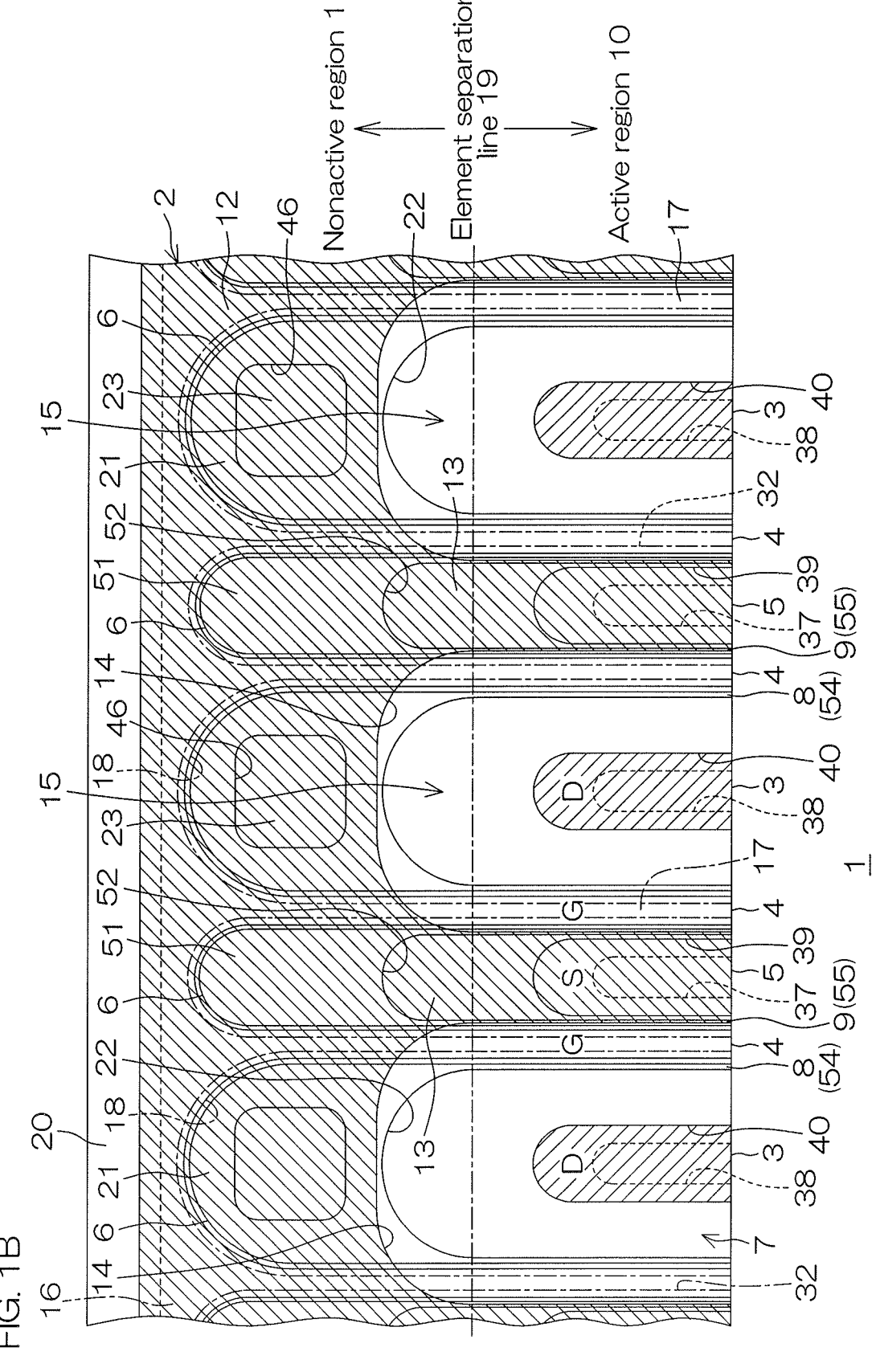
FIG. 1B is a schematic plan view illustrating a semiconductor device according to a preferred embodiment of the present invention.

FIG. 1A and FIG. 1B are schematic plan views illustrating a semiconductor device 1 according to a preferred embodiment of the present invention. For the sake of clarity, FIG. 1A and FIG. 1B illustrate the shape of a first source field plate 8 as a typical example among the first source field plate 8, a second source field plate 59, and a third source field plate 60, which are to be discussed later. Furthermore, FIG. 1A illustrates the first source field plate 8 and a floating plate 9 as a hatched region, while FIG. 1B illustrates a drain electrode 3 and a source electrode 5 as a hatched region. Furthermore, FIG. 1A and FIG. 1B illustrate a gate electrode 4 as a region indicated by an alternate long and short dashed line. FIG. 1A and FIG. 1B are the same except that different regions are hatched.

In a group-III nitride semiconductor layered structure 2 serving as a base, the semiconductor device 1 has the drain electrode 3, the gate electrode 4, the source electrode 5, and a plate film 6. For example, as illustrated in FIG. 1A and FIG. 1B, the drain electrode 3 (D), the gate electrode 4 (G), and the source electrode 5 (S) are disposed cyclically in the order of DGSGD. This defines an element structure 7 in which the drain electrode 3 and the source electrode 5 sandwich the gate electrode 4. The plate film 6 is disposed between the gate and the source and between the drain and the gate, respectively. The first source field plate 8 serving as an example of the first conductive layer of the present invention is disposed between the drain and the gate, while the floating plate 9 serving as an example of the floating conductive layer of the present invention is disposed between the gate and the source.

On the surface of the group-III nitride semiconductor layered structure 2, it is possible to define an active region 10 that includes the element structure 7 and a nonactive region 11 other than the active region 10. As illustrated in FIG. 1A and FIG. 1B, the nonactive region 11 may only have to be adjacent to the active region 10 or may also surround the active region 10.

The source electrode 5 includes a base 12 serving as an example of an extension of the present invention on the nonactive region 11 and a plurality of electrodes 13 integrally connected to the base 12. The source electrode 5 of this preferred embodiment has a comb-tooth shape in which the plurality of electrodes 13 extend in parallel to each other in a striped shape. The base 12 has a connection end 14 for the electrodes 13 within the nonactive region 11. The plurality of electrodes 13 extend from the connection end 14 toward the active region 10. That is, the plurality of electrodes 13 are disposed across the active region 10 and the nonactive region 11.

A space 15 between the adjacent electrodes 13 is a region in which the drain electrode 3 is disposed. In this preferred embodiment, the drain electrode 3 that is linear in shape is disposed in each space 15, thereby allowing two comb-tooth-shaped source electrode 5 and drain electrode 3 to engage with each other. Note that although not illustrated, like the source electrode 5, the drain electrode 3 may also include a base on the nonactive region 11 and a plurality of electrodes (portions disposed in the space 15) integrally connected to the base.

The gate electrode 4 includes a base 16 on the nonactive region 11 and a plurality of electrodes 17 integrally connected to the base 16. The gate electrode 4 of this preferred embodiment has a comb-tooth shape in which the plurality of electrodes 17 extend in parallel to each other in a striped shape. The base 16 has connection ends 18 for the electrodes 17 within the nonactive region 11. The connection end 18 is provided outside the connection end 14 of the source electrode 5 (relatively distant from the active region 10) with respect to the boundary (an element separation line 19) between the active region 10 and the nonactive region 11. The plurality of electrodes 17 extend from the connection end 18 toward the active region 10. That is, the plurality of electrodes 17 are disposed across the active region 10 and the nonactive region 11. Furthermore, the base 16 of the gate electrode 4 includes a lead portion 20 outside the base 12 of the source electrode 5. For example, the lead portion 20 is a region for forming a contact to the gate electrode 4.

The first source field plate 8 includes a base 21 serving as an example of an extension of the present invention on the nonactive region 11 and a plurality of electrodes 54 integrally connected to the base 21. The first source field plate 8 of this preferred embodiment has the shape of an arch that allows a pair of electrodes 54 to extend from both ends of the base 21. The base 21 has a connection end 22 for the electrodes 54 within the nonactive region 11. The connection end 22 is provided generally at the same position as that of the connection end 14 of the source electrode 5 with respect to the element separation line 19. The pair of electrodes 54 extend from the connection end 22 toward the active region 10. That is, the pair of electrodes 54 are disposed across the active region 10 and the nonactive region 11.

The base 12 of the source electrode 5 and the base 21 of the first source field plate 8 partially overlap within the nonactive region 11. At this overlap portion, the source electrode 5 and the first source field plate 8 are connected together through a source contact 23. For example, as illustrated in FIG. 1A and FIG. 1B, the source contact 23 is provided at a position opposing the space 15 (a position at which the extension of the electrodes 13 is avoided).

Providing the source contact 23 in the nonactive region 11 in this manner will eliminate the need for providing the active region 10 with a conductive structure that is electrically connected to, respectively, the source electrode 5 and the first source field plate 8 over the gate electrode 4 as a structure to electrically connect the source electrode 5 and the first source field plate 8. Such a conductive structure provided in the active region 10 may cause an increase in the parasitic capacitance of the semiconductor device 1. However, as described above, connecting between the source electrode 5 and the first source field plate 8 in the nonactive region 11 can prevent an increase in parasitic capacitance.

The floating plate 9 includes a base 51 on the nonactive region 11 and a plurality of electrodes 55 integrally connected to the base 51. The floating plate 9 of this preferred embodiment has the shape of an arch that allows a pair of electrodes 55 to extend from both ends of the base 51. The base 51 has a connection end 52 for the electrodes 55 within the nonactive region 11. The connection end 52 is provided generally at the same position as that of the connection end 14 of the source electrode 5 with respect to the element separation line 19. The pair of the electrodes 55 extend from the connection end 52 toward the active region 10. That is, the pair of the electrodes 55 are disposed across the active region 10 and the nonactive region 11.

Note that FIG. 1A and FIG. 1B illustrated only the connection mode between the first source field plate 8 and the source electrode 5. However, the second source field plate 59 and the third source field plate 60 to be discussed later are, like the first source field plate 8, also connected to the source electrode 5. For example, the second source field plate 59 and the third source field plate 60 may also be defined in the shape of an arch that is similar to the first source field plate 8 and contacted in the nonactive region 11 to the source electrode 5 at a position different from that of the source contact 23.

Now, referring mainly to FIG. 2 and FIG. 3, the cross-sectional structure of the semiconductor device 1 will be described.

Figure 2:
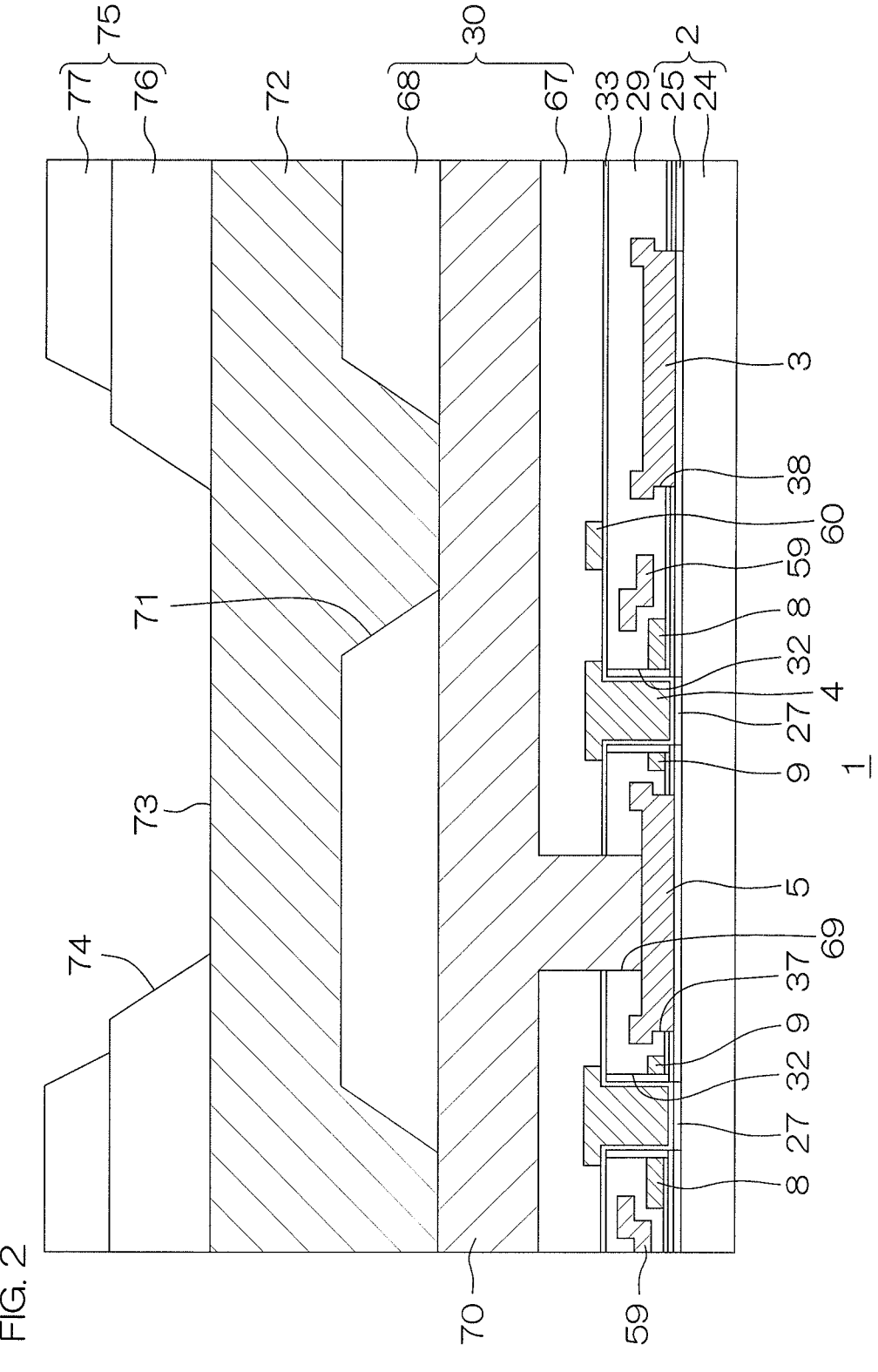
FIG. 2 is a schematic cross-sectional view illustrating the semiconductor device.

FIG. 2 is a schematic cross-sectional view illustrating the semiconductor device 1. FIG. 3 is an enlarged view of the main portion of the semiconductor device 1 in FIG. 2. Note that FIG. 2 is a schematic view not for illustrating a cross section at a particular position of FIG. 1 but only for facilitating the understanding of a preferred embodiment of the present invention. Furthermore, for the sake of clarity, in FIG. 2, only the electrical conductor among the components of the semiconductor device 1 is hatched and only the required reference symbols are shown.

The group-III nitride semiconductor layered structure 2 includes an electron traveling layer 24 serving as an example of a first semiconductor layer of the present invention and an electron supply layer 25 serving as an example of a second semiconductor layer of the present invention on the electron traveling layer 24. The electron traveling layer 24 and the electron supply layer 25 are formed of group-III nitride semiconductors having mutually different Al compositions. For example, the electron traveling layer 24 may be formed of a GaN layer at a thickness of 0.1 μm to 3 μm. For example, the electron supply layer 25 may be formed of an AlN layer at a thickness of 1 nm to 7 nm. Note that the electron traveling layer 24 and the electron supply layer 25 are not limited to a particular composition but may be formed of an $Al_xGa_{1-x}N$ layer ($0 \leq x \leq 1$) and $Al_yGa_{1-y}N$ layer ($0 \leq y \leq 1$), respectively, so long as the composition is capable of defining a heterojunction to generate a two-dimensional electron gas.

As described above, the electron traveling layer 24 and the electron supply layer 25 are formed of nitride semiconductors having mutually different Al compositions, with a lattice mismatch occurring between the electron traveling layer 24 and the electron supply layer 25. Then, due to a polarization caused by this lattice mismatch, a two-dimensional electron gas 26 caused by the polarization is spread at a position near the interface between the electron traveling layer 24 and the electron supply layer 25 (e.g., at a distance of about several angstroms from the interface). The concentration of the two-dimensional electron gas 26 may be, e.g., $0.5 \times 10^{13}$ cm$^{-2}$ to $1.0 \times 10^{13}$ cm$^{-2}$.

On the electron supply layer 25, an oxide film 27 is selectively defined so as to extend from the surface thereof to the electron traveling layer 24. The oxide film 27 has a thickness generally equal to that of the electron supply layer 25. For example, the oxide film 27 is a thermal oxide film or an oxide film that was defined without damage to the interface with the electron traveling layer 24. When the electron supply layer 25 is an AlN layer, then the oxide film 27 may be formed of an AlON film.

Note that the group-III nitride semiconductor layered structure 2 may be deposited on a substrate such as a silicon substrate with a buffer layer sandwiched between the structure 2 and the substrate.

Figure 3:
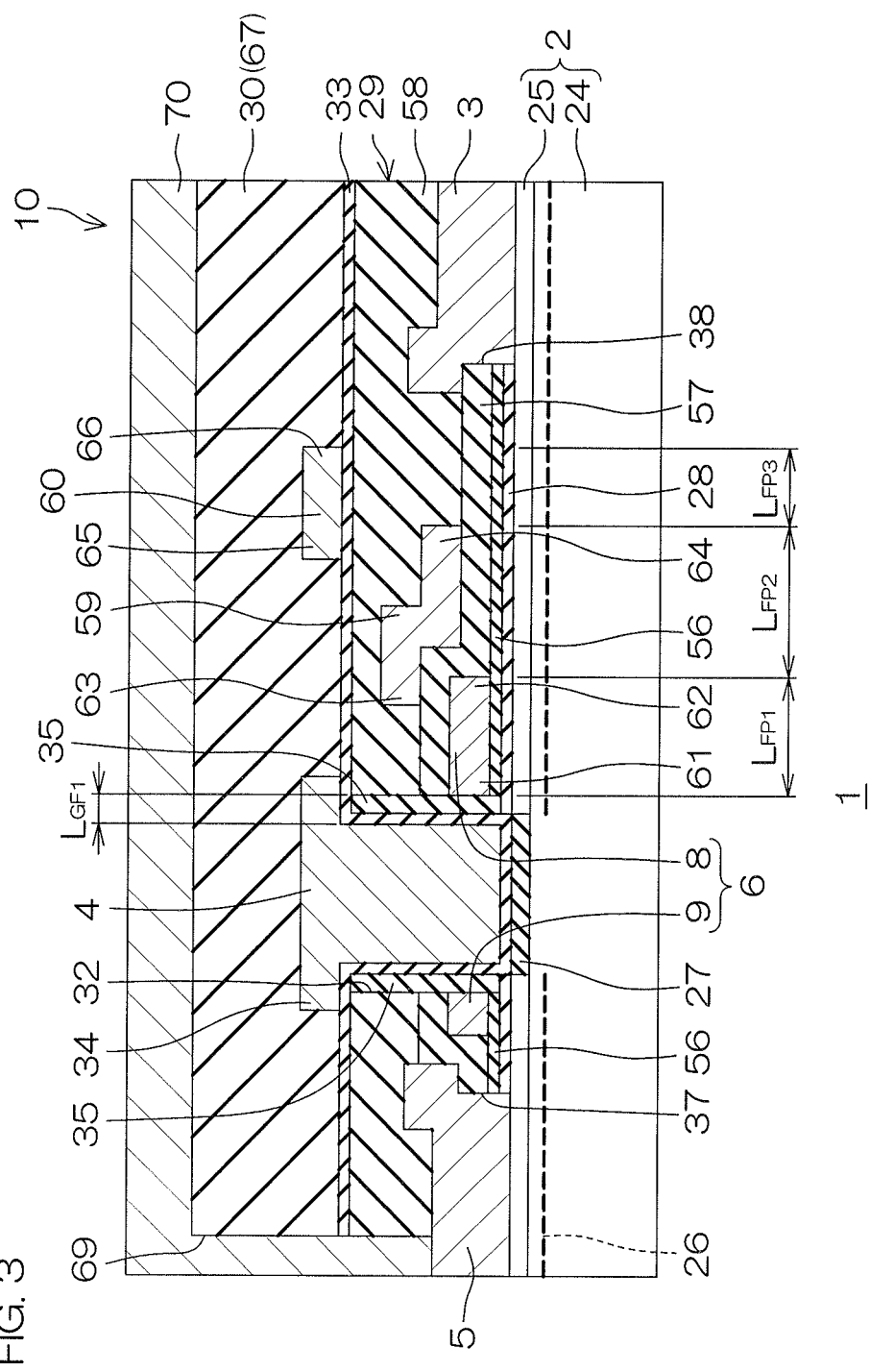
FIG. 3 is an enlarged view illustrating the main portion of the semiconductor device in FIG. 2.

As illustrated in FIG. 3, the semiconductor device 1 further includes an underlayer film 28, a passivation film 29 serving as an example of an insulating layer of the present invention, and an interlayer insulating film 30, which are defined on or above the group-III nitride semiconductor layered structure 2.

The underlayer film 28 is defined on the entire surface of the group-III nitride semiconductor layered structure 2 that includes the area in which the drain electrode 3 and the source electrode 5 are defined. For example, the underlayer film 28 may be formed of a SiN film at a thickness of 1 nm to 200 nm.

The passivation film 29 covers the underlayer film 28 and includes a first passivation film 56 serving as an example of a first insulating layer of the present invention, a second passivation film 57 serving as an example of a second insulating layer of the present invention, and a third passivation film 58 serving as an example of a third insulating layer of the present invention.

The first passivation film 56, the second passivation film 57, and the third passivation film 58 may be formed of a SiN film or $SiO_2$ film, but may be preferably formed of a SiN film from the viewpoint of alleviating the concentration of an electric field. Furthermore, the passivation film 29 may have a thickness of 180 nm to 330 nm.

Individually, the first passivation film 56 may have a thickness of 30 nm to 80 nm, the second passivation film 57 may have a thickness of 75 nm to 125 nm, and the third passivation film 58 may have a thickness of 75 nm to 125 nm.

The passivation film 29 and the underlayer film 28 are provided with a gate opening 32 defined to reach the group-III nitride semiconductor layered structure 2. At the bottom of the gate opening 32, the oxide film 27 is exposed. There is defined a gate insulating film 33 to cover the bottom and the side of the gate opening 32. The gate insulating film 33 is defined to cover the upper surface of the passivation film 29 (in this preferred embodiment, the upper surface of the third passivation film 58 that is the uppermost layer) in addition to the inside of the gate opening 32.

For example, the gate insulating film 33 may be formed of at least one type of material film selected from the group consisting of Si, Al, and Hf as a component element. More specifically, the gate insulating film 33 may be formed of at least one type of material film selected from the group consisting of SiN, $SiO_2$, SiON, $Al_2O_3$, AlN, AlON, HfSiO and $HfO_2$, etc. Of these, the $Al_2O_3$ film may be preferably selected. Furthermore, the gate insulating film 33 may have a thickness of 10 nm to 100 nm.

The gate electrode 4 further includes an overlap portion 34 which is embedded in the gate opening 32 and defined on the gate insulating film 33 (the passivation film 29) on the circumferential edge of the gate opening 32. This overlap portion 34 opposes, in the thickness direction of the passivation film 29, the first source field plate 8 (in this preferred embodiment, an end 61 of the first source field plate 8 toward the gate electrode 4 side) with the second passivation film 57 and the third passivation film 58 sandwiched between the overlap portion 34 and the first source field plate 8.

Note that the gate electrode 4 may be filled in the gate opening 32 so as not to be protruded above the opening end of the gate opening 32. For example, the gate electrode 4 may be formed of a metal electrode such as Mo or Ni, or of a semiconductor electrode such as doped polysilicon. Since the metal electrode is inferior to polysilicon in embeddability, the overlap portion 34, in particular, tends to be readily defined when the metal electrode is employed.

The first source field plate 8 and the floating plate 9 are disposed on the side of the gate electrode 4 so as to partially define the side of the gate opening 32. More specifically, the first source field plate 8 and the floating plate 9 are defined on the underlayer film 28, with the first passivation film 56 interposed between the first source field plate 8 or the floating plate 9 and the underlayer film 28, so as to be exposed near the lower end of the side of the gate opening 32. That is, the side of the gate opening 32 has the lower side that is defined by the first source field plate 8 and the floating plate 9 and the upper side defined by part of the passivation film 29 (specifically, the second passivation film 57 and the third passivation film 58), thus having a stacked layer interface of a conductive layer/an insulating layer.

Then, so as to contact the first source field plate 8 and the floating plate 9, there is defined an insulating side wall 35 on the side of the gate opening 32. That is, the side wall 35 is disposed between the side of the gate opening 32 and the gate insulating film 33. For example, the side wall 35 may be formed of at least one type of material film selected from the group consisting of $SiO_2$, SiN, and SiON. Of these films, the $SiO_2$ film may be preferably selected. Furthermore, the side wall 35 may have a thickness of 10 nm to 200 nm.

The first source field plate 8 and the floating plate 9 are insulated from the gate electrode 4 by means of the side wall 35 and the gate insulating film 33. For example, the distance $L_{GF1}$ between the gate electrode 4 and the first source field plate 8 or the floating plate 9 is 1 µm or less, preferably 50 nm to 200 nm. In this preferred embodiment, the distance $L_{GF1}$ is defined by the total thickness of the gate insulating film 33 and the side wall 35. However, in an arrangement without the side wall 35, the distance $L_{GF1}$ may be equal to the thickness of the gate insulating film 33. Furthermore, for example, when the withstand voltage of the semiconductor device 1 is 200 V or less, the length $L_{FP1}$ of the first source field plate 8 may be 0.3 µm to 0.6 µm. Furthermore, the first source field plate 8 and the floating plate 9 may be formed of Mo film at a thickness of 10 nm to 200 nm.

The second passivation film 57 is deposited on the first passivation film 56 so as to cover the first source field plate 8 and the floating plate 9. This causes the first source field plate 8 and the floating plate 9 to be sandwiched between the first passivation film 56 and the second passivation film 57 and embedded in the passivation film 29.

To penetrate the second passivation film 57, the first passivation film 56, and the underlayer film 28, there are defined a source contact hole 37 and a drain contact hole 38 that reach the group-III nitride semiconductor layered structure 2. The source contact hole 37 and the drain contact hole 38 are defined at a position away from the gate opening 32 in a sideward direction. The source contact hole 37 and the drain contact hole 38 have the source electrode 5 and the drain electrode 3 embedded, respectively. The source electrode 5 and the drain electrode 3 are electrically connected to the group-III nitride semiconductor layered structure 2 inside the source contact hole 37 and the drain contact hole 38, respectively.

The source electrode 5 and the drain electrode 3 are each embedded in the passivation film 29 and in ohmic contact with the group-III nitride semiconductor layered structure 2. As illustrated in FIG. 1A and FIG. 1B, the source electrode 5 and the drain electrode 3 have ends in the depth direction of the space 15 that are disposed at the mutually same position. However, for example, the end of the drain electrode 3 may be selectively made to retreat in a direction from the nonactive region 11 to the active region 10.

Furthermore, the source electrode 5 and the drain electrode 3 have tops that are exposed from the surface of the second passivation film 57. Still furthermore, the source electrode 5 and the drain electrode 3 may be formed of a stacked layer film of Ti/Al.

On the second passivation film 57, the second source field plate 59 is further defined. The second source field plate 59 is disposed in an area closer to the drain electrode 3 side with respect to the first source field plate 8. In this preferred embodiment, in the thickness direction of the passivation film 29, the second source field plate 59 has an end 63 toward the gate electrode 4 side that opposes the first source field plate 8 (in this preferred embodiment, an end 62 of the first source field plate 8 toward the drain electrode 3 side) with the second passivation film 57 sandwiched between the end 63 and the end 62. Furthermore, when the length $L_{FP2}$ of the second source field plate 59 (or the length from the end 62 of the first source field plate 8 as illustrated in FIG. 3 when overlapping the first source field plate 8) may be, e.g., 0.3 µm to 1.0 µm when the withstand voltage of the semiconductor device 1 is 200 V or less. Furthermore, the second source field plate 59 may be formed of the same material as that of the source electrode 5 and the drain electrode 3 at a thickness of 50 nm to 400 nm.

The third passivation film 58 is deposited on the second passivation film 57 so as to cover the second source field plate 59, the drain electrode 3, and the source electrode 5. This allows the second source field plate 59, the drain electrode 3, and the source electrode 5 to be sandwiched between the second passivation film 57 and the third passivation film 58 and embedded in the passivation film 29.

Note that in this preferred embodiment, the passivation film 29 may have a contact hole 46 defined to reach the first source field plate 8 as an arrangement that appears on a cross-section at a position different from that in FIG. 3. The contact hole 46 may have the source contact 23 which is embedded therein as illustrated in FIG. 1 and connected to the first source field plate 8.

Above the passivation film 29 (in this preferred embodiment, above the third passivation film 58), the third source field plate 60 is formed with the gate insulating film 33 interposed between the passivation film 29 and the third source field plate 60. The third source field plate 60 is disposed in an area closer to the drain electrode 3 side than the second source field plate 59 is. In this preferred embodiment, in the thickness direction of the passivation film 29, the third source field plate 60 has an end 65 toward the gate electrode 4 side that opposes the second source field plate 59 (in this preferred embodiment, an end 64 of the second source field plate 59 toward the drain electrode 3 side) with the third passivation film 58 sandwiched between the end 65 and the end 64. On the other hand, an end 66 of the third source field plate 60 toward the drain electrode 3 side does not overlap the drain electrode 3 but is disposed at a position spaced away from the drain electrode 3 toward the gate electrode 4 side. Furthermore, the length $L_{FP3}$ of the third source field plate 60 (or the length from the end 64 of the second source field plate 59 as illustrated in FIG. 3 when overlapping the second source field plate 59) may be, for example, 0.3 µm to 1.0 µm when the withstand voltage of the semiconductor device 1 is 200 V or less. Furthermore, the third source field plate 60 may be formed of the same material as that of the gate electrode 4 at a thickness of 50 nm to 1000 nm.

The interlayer insulating film 30 includes a first interlayer insulating film 67 and a second interlayer insulating film 68. For example, the first interlayer insulating film 67 and the second interlayer insulating film 68 may be formed of $SiO_2$ film. Furthermore, the first interlayer insulating film 67 and the second interlayer insulating film 68 may have a thickness of 0.3 µm to 1.5 µm and 0.3 µm to 1.5 µm, respectively.

The first interlayer insulating film 67 is deposited on the passivation film 29 (or the surface of the gate insulating film 33 on the passivation film 29 in this preferred embodiment) so as to cover the gate electrode 4 and the third source field plate 60. The first interlayer insulating film 67 is provided with a contact hole 69 defined to expose part of the source electrode 5. Note that although not illustrated, the first interlayer insulating film 67 may be provided with a contact hole defined to expose part of the drain electrode 3 at a position not shown.

On the first interlayer insulating film 67, a first source conductor wiring 70 is formed. The first source conductor wiring 70 is connected to the source electrode 5 through the contact hole 69. Furthermore, for example, the first source conductor wiring 70 may be formed of Al or Al alloy.

The second interlayer insulating film 68 is deposited on the first interlayer insulating film 67 so as to cover the first source conductor wiring 70. The second interlayer insulating film 68 is provided with a contact hole 71 defined to expose part of the first source conductor wiring 70.

On the second interlayer insulating film 68, a second source conductor wiring 72 is formed. The second source conductor wiring 72 is connected to a first source conductor wiring 70 through the contact hole 71. Furthermore, for example, the second source conductor wiring 72 may be formed of Al or Al alloy.

Then, so as to cover the second source conductor wiring 72 (or the uppermost layer conductor wiring in this preferred embodiment), there is defined a surface protective film 75. The surface protective film 75 has an opening 74 to expose part of the second source conductor wiring 72 as a source pad 73. Furthermore, the surface protective film 75 may have a structure in which a first surface protective film 76 and a second surface protective film 77 are deposited sequentially from the second source conductor wiring 72 side. For example, the first surface protective film 76 may be formed of $SiO_2$ film.

Furthermore, for example, the first surface protective film 76 may have a thickness of 0.2 μm to 2.0 μm. For example, the second surface protective film 77 may be formed of polyimide film. Furthermore, for example, the second surface protective film 77 may have a thickness of 1.0 μm to 20 μm.

Now, referring to FIG. 4A to FIG. 4R, description will be made to a method for manufacturing the semiconductor device 1.

Figure 4A:
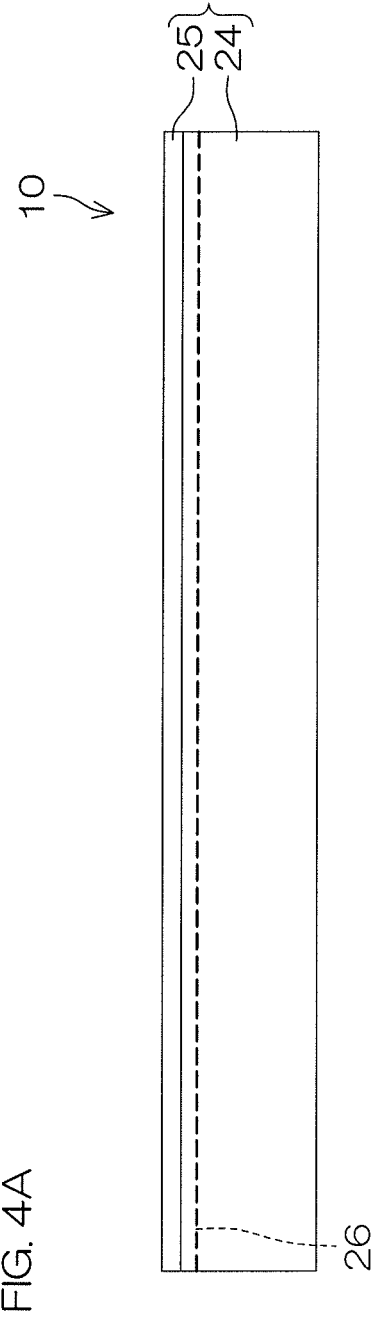
FIG. 4A to FIG. 4R are views illustrating part of a manufacturing process of the semiconductor device.
Figure 4B:
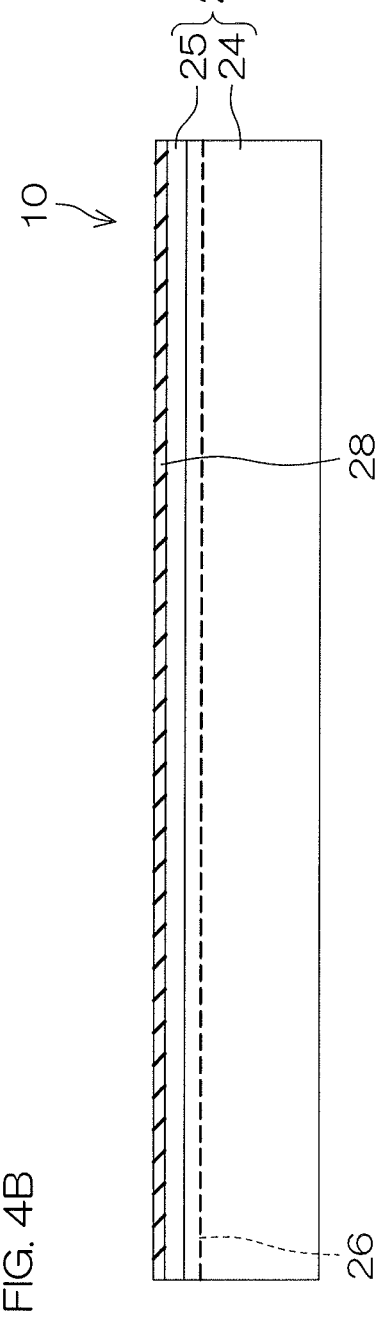
Figure 4C:
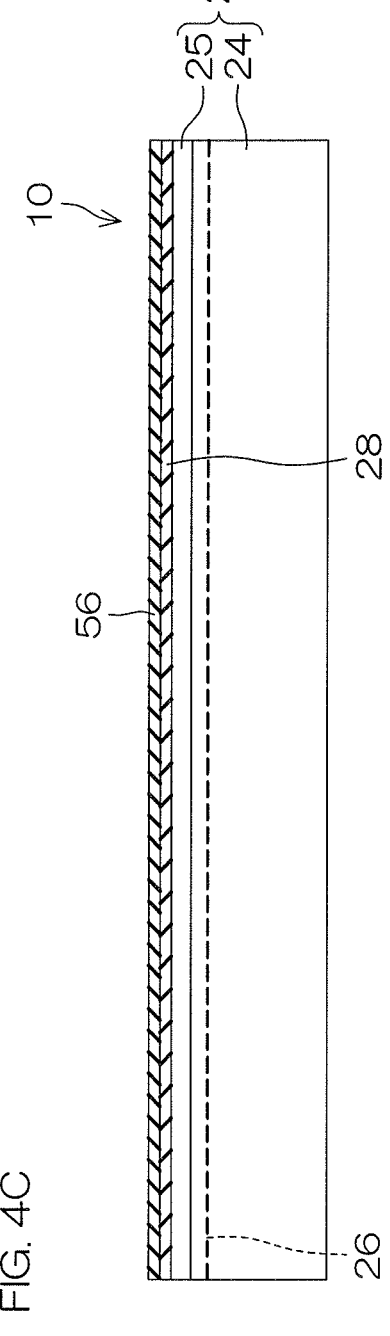
Figure 4D:
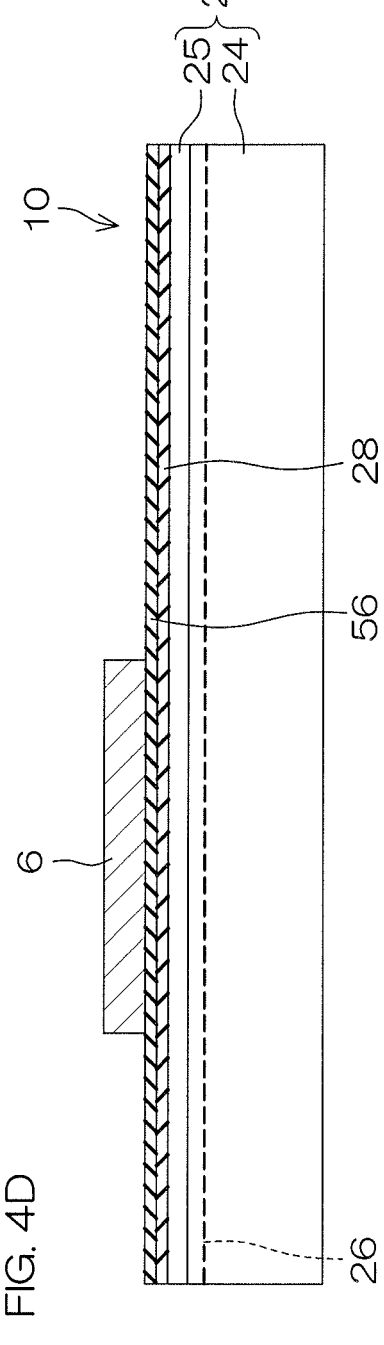
Figure 4E:
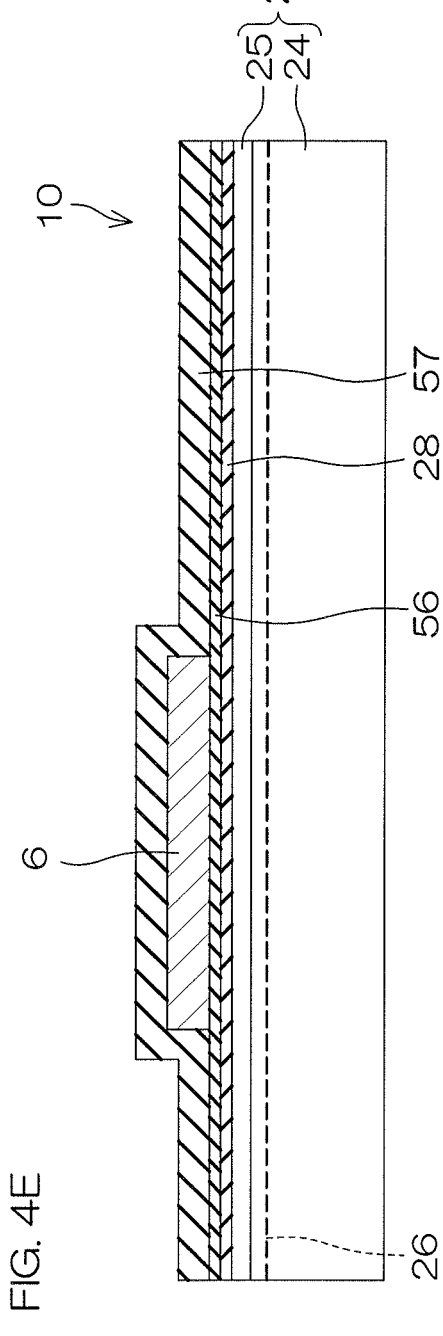
Figure 4F:
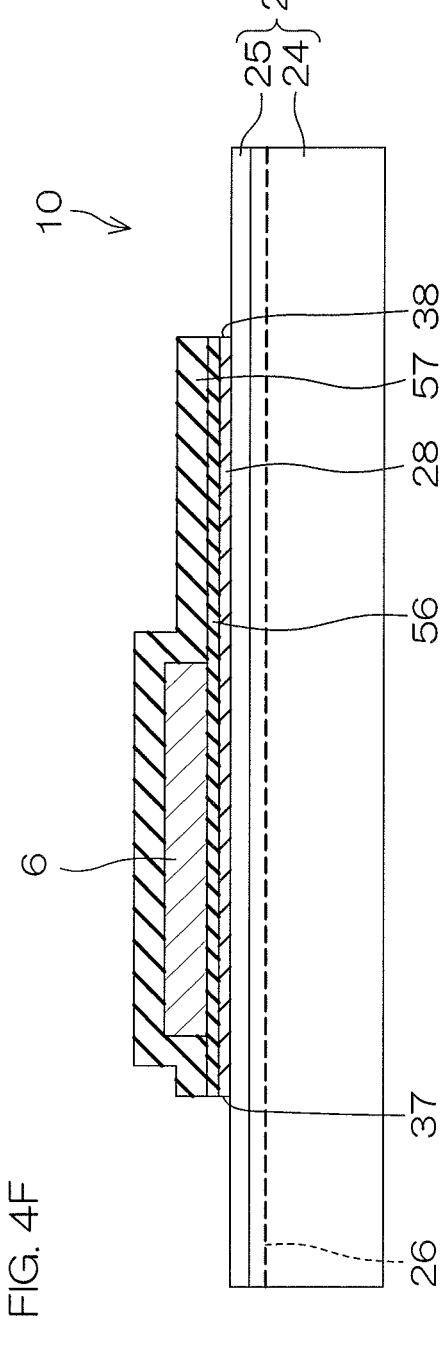
Figure 4G:
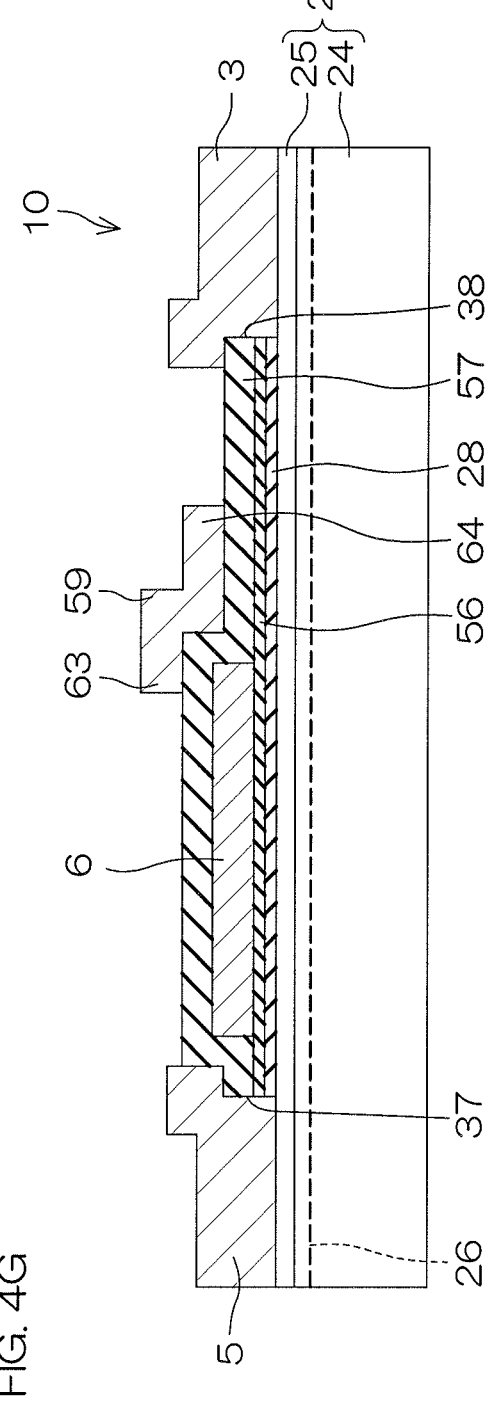
Figure 4H:
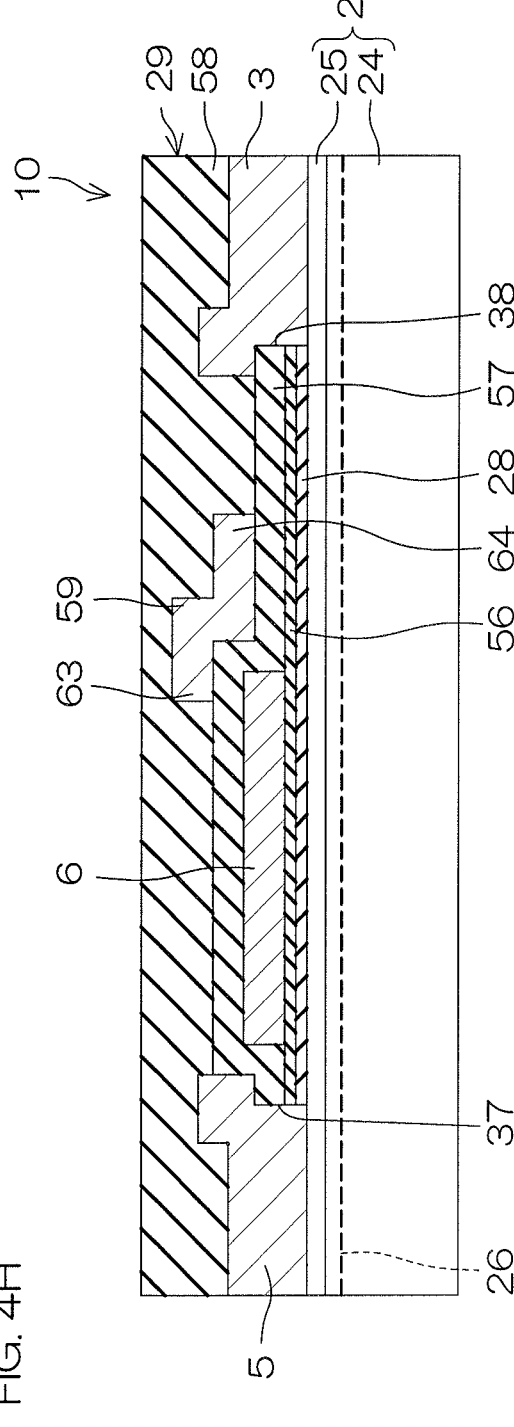
Figure 4:
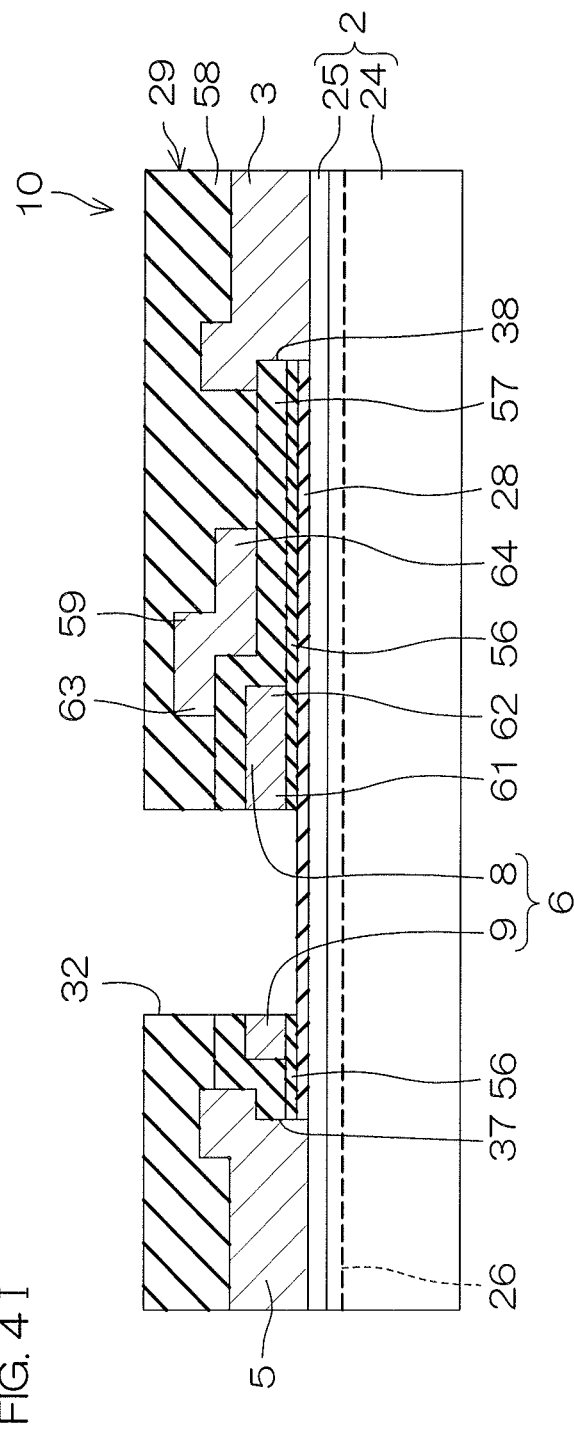
Figure 4J:
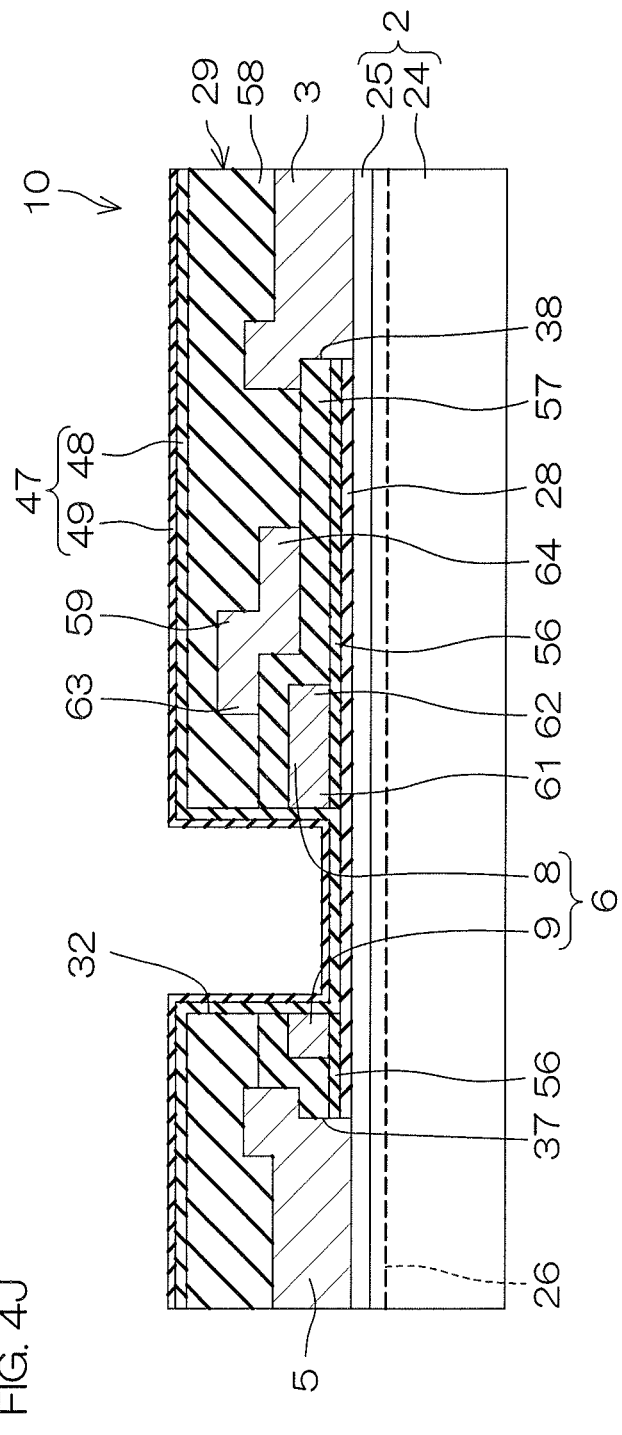
Figure 4K:
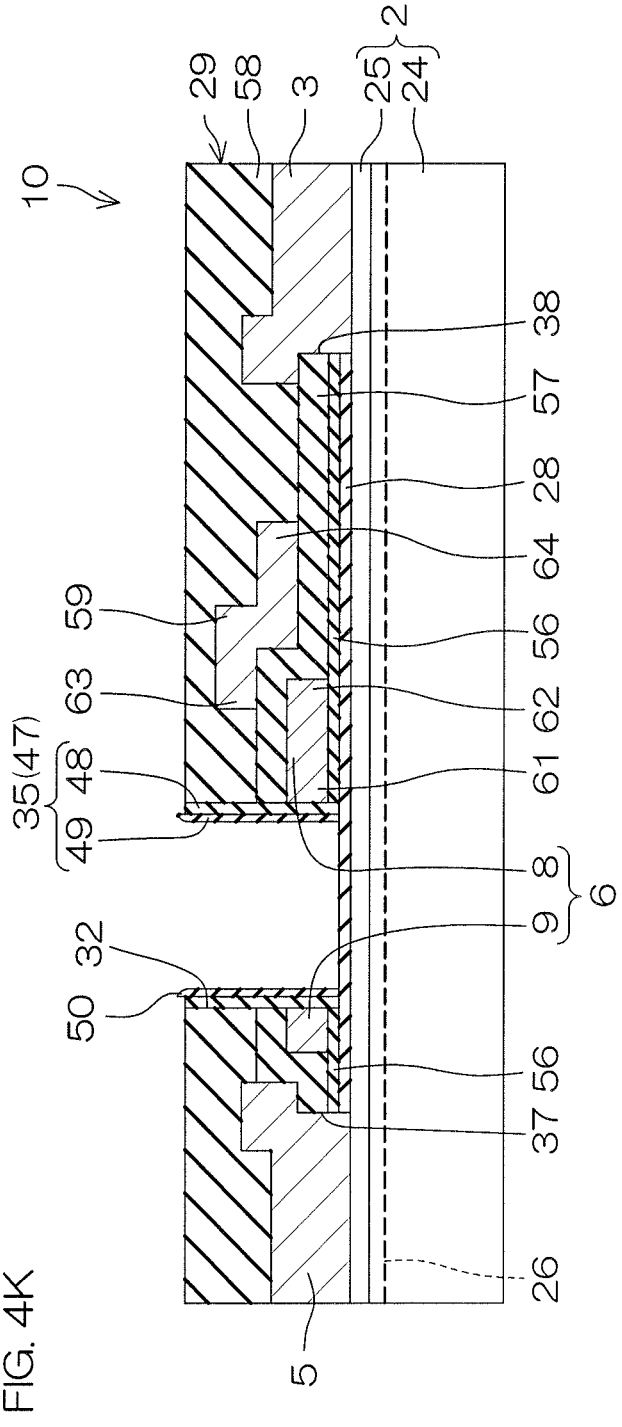
Figure 4L:
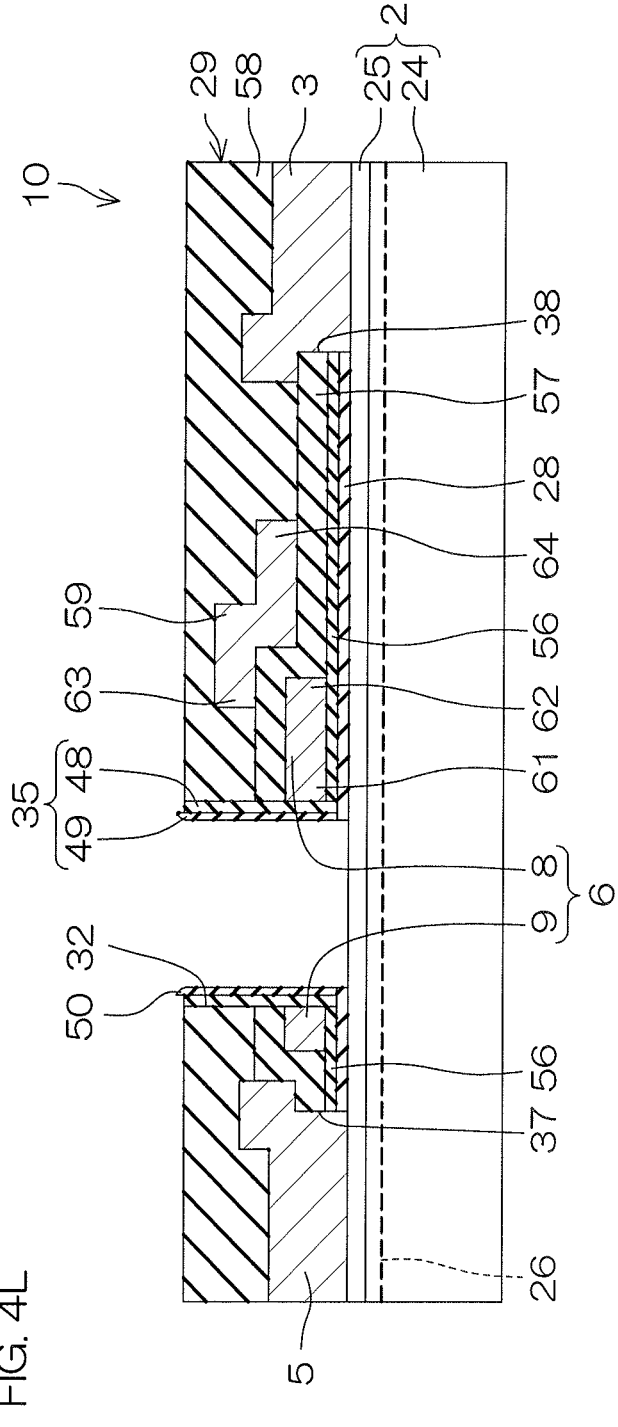
Figure 4M:
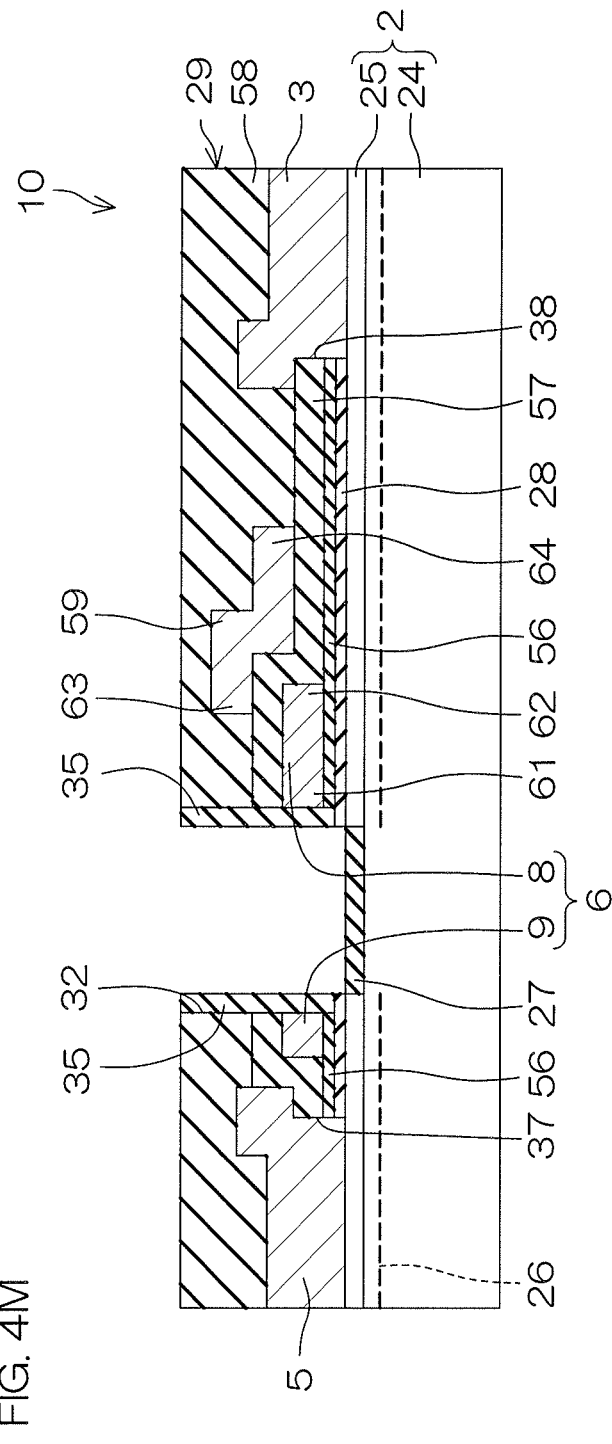
Figure 4N:
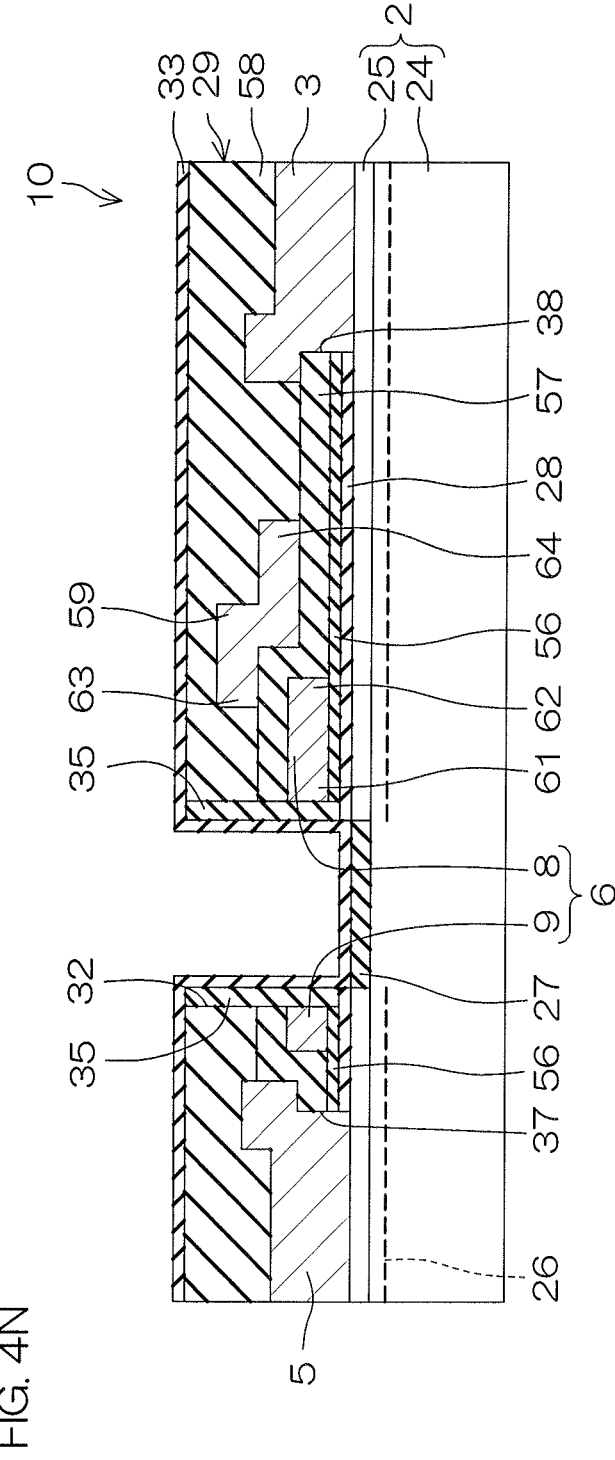
Figure 40:
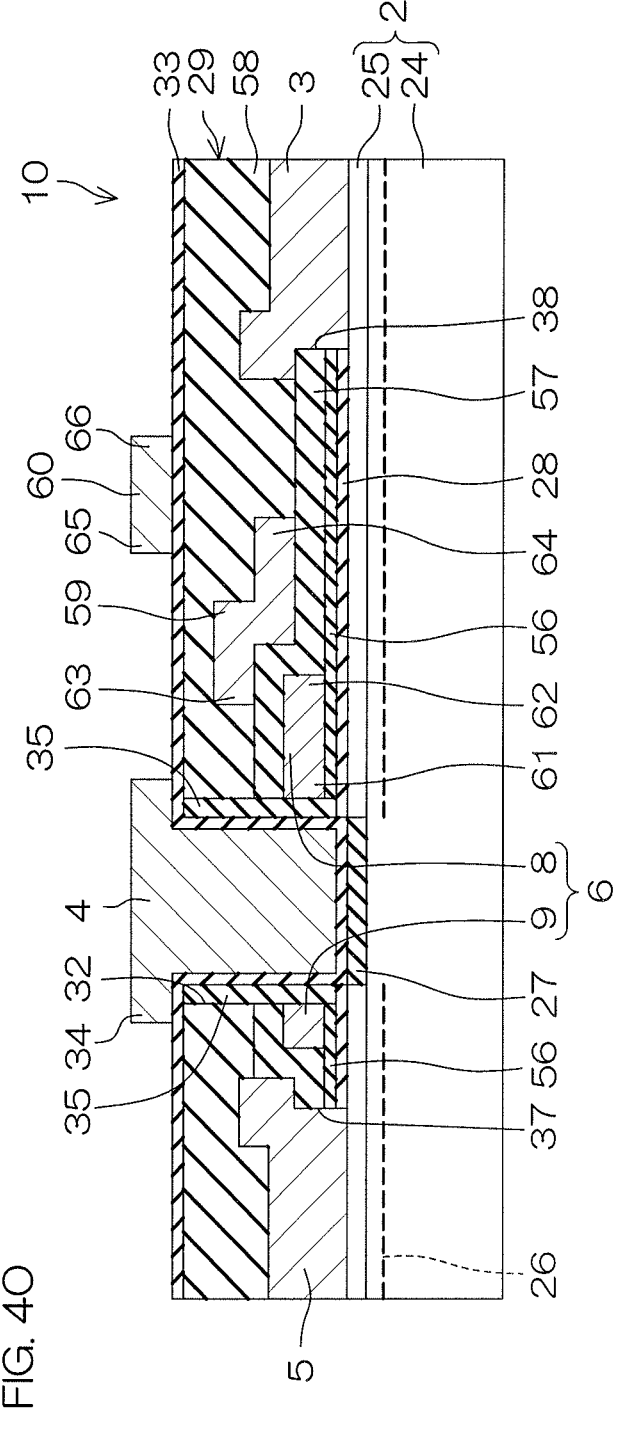
Figure 4P:
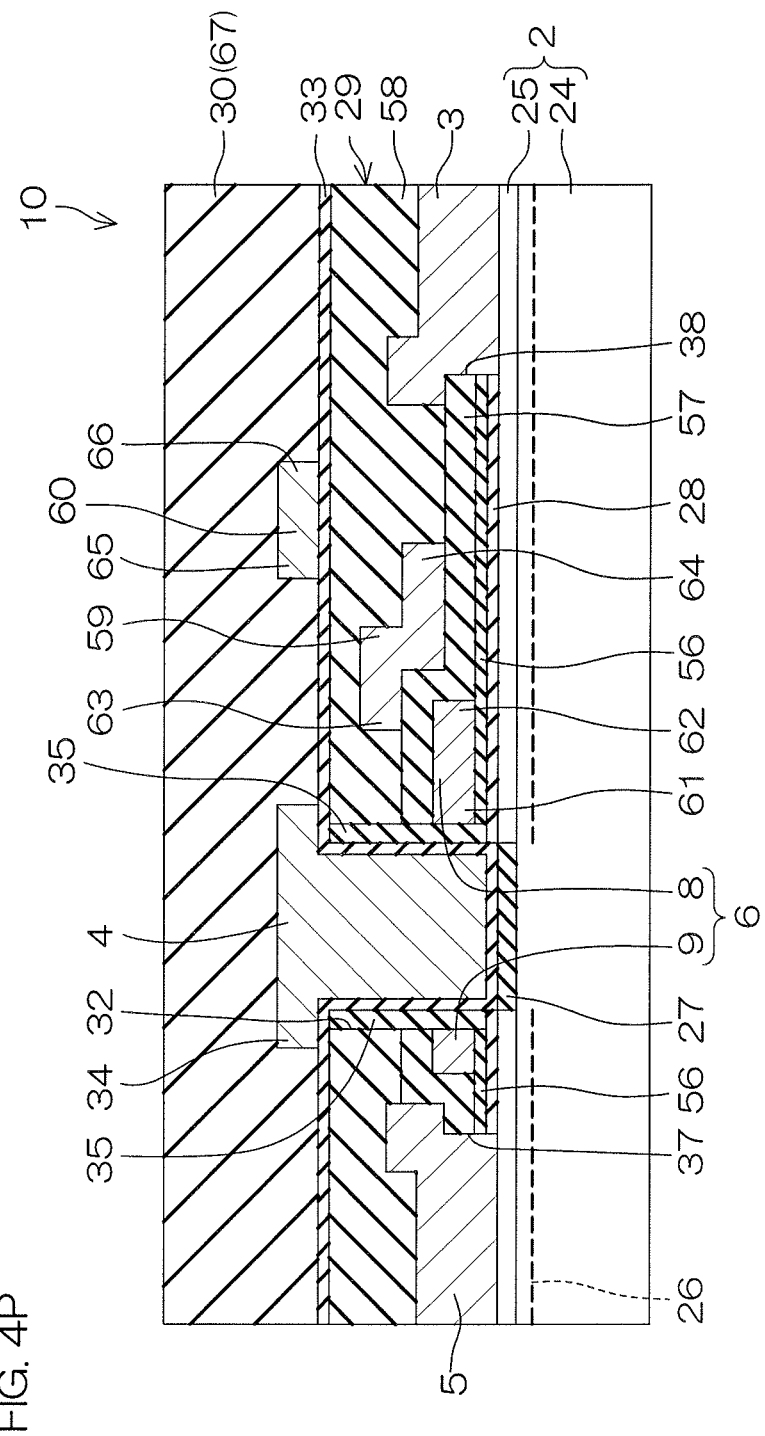
Figure 4Q:
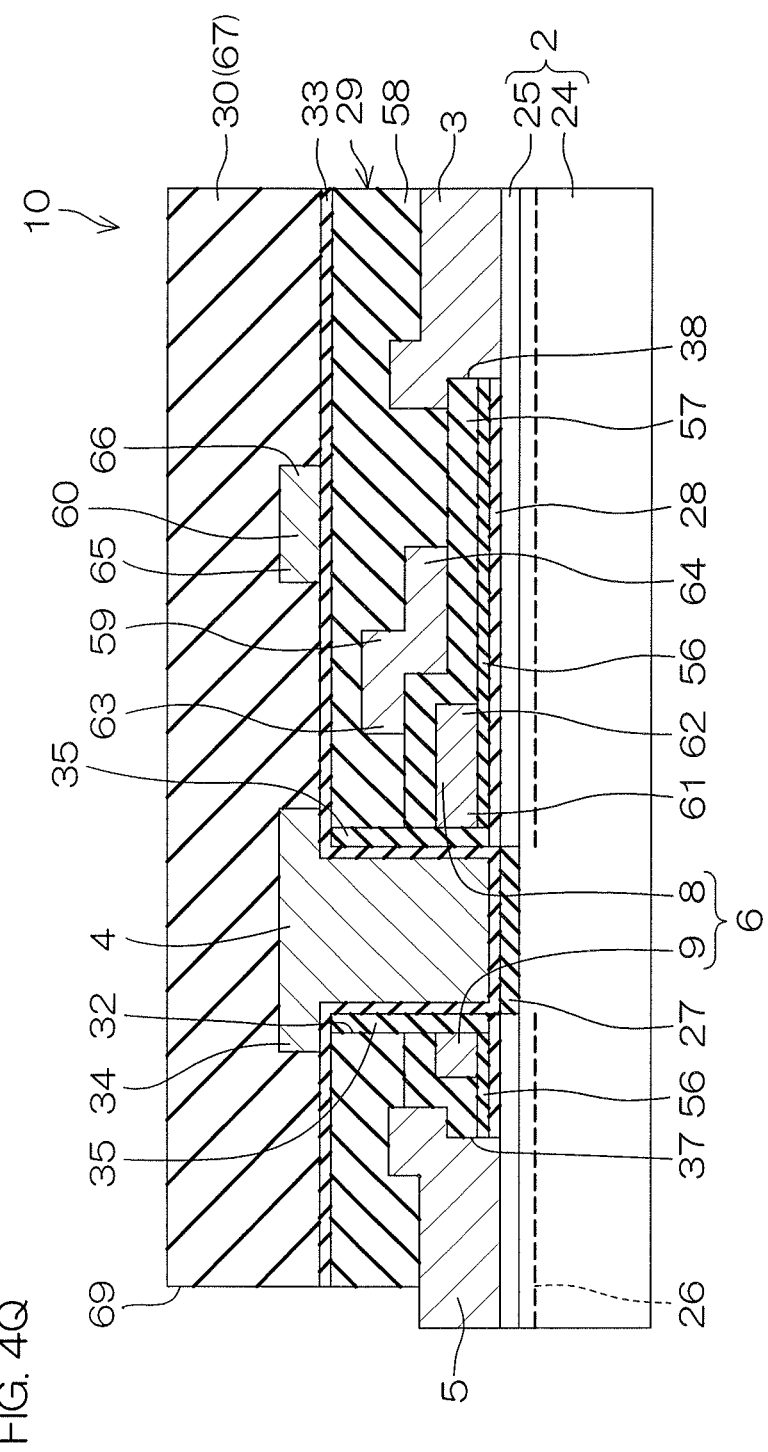
Figure 4R:
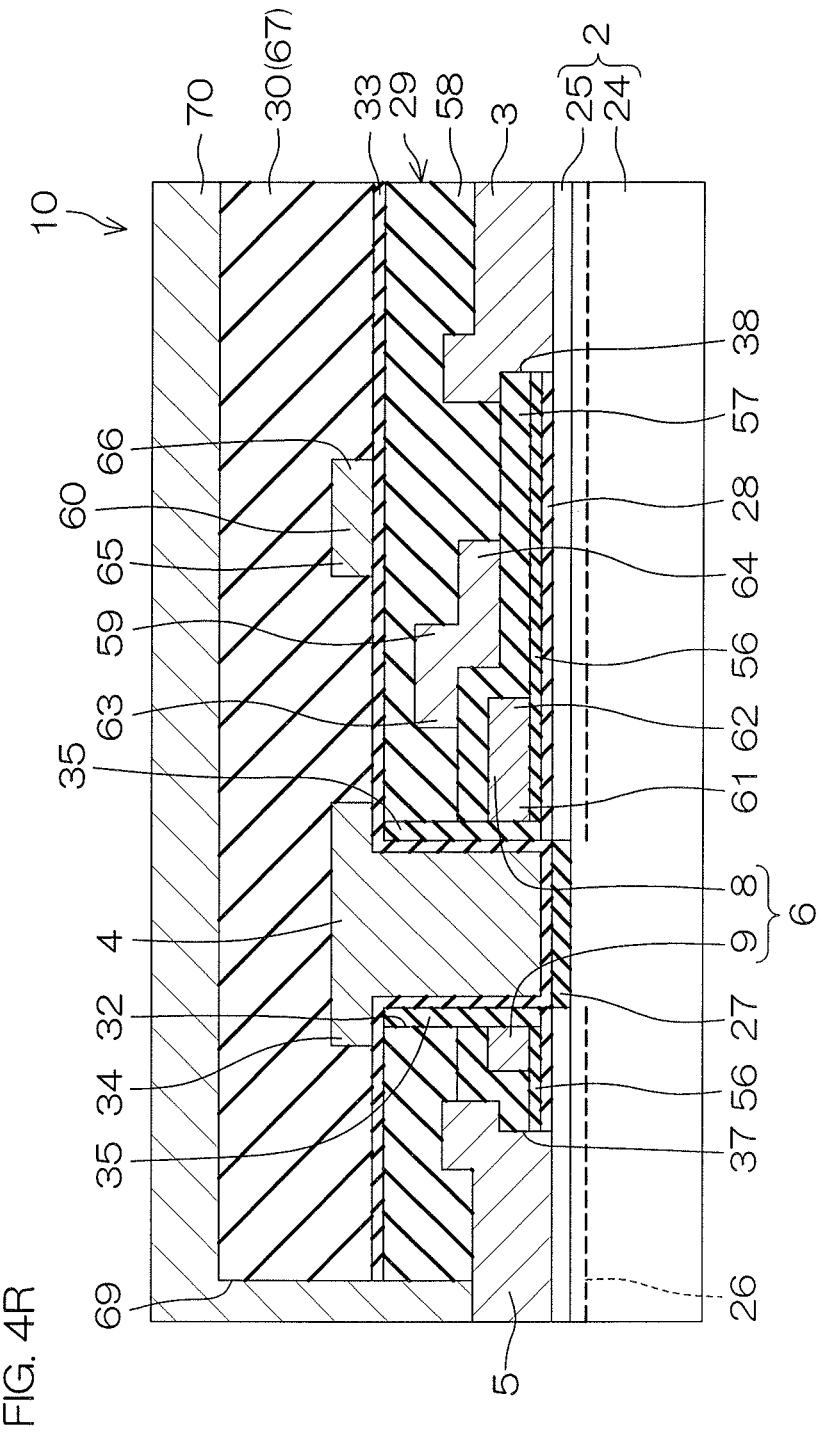

FIG. 4A to FIG. 4R are views illustrating the process of manufacturing the semiconductor device 1 in the order of steps.

To manufacture the semiconductor device 1, for example, on a substrate (not illustrated), a buffer layer (not illustrated) and the electron traveling layer 24 are epitaxially grown in a sequential order, and as illustrated in FIG. 4A, the electron supply layer 25 is further epitaxially grown on the electron traveling layer 24. In this manner, the group-III nitride semiconductor layered structure 2 is defined.

Next, as illustrated in FIG. 4B, so as to cover the entire surface of the electron supply layer 25, the underlayer film 28 is defined, e.g., by a CVD (chemical vapor deposition) method.

Next, as illustrated in FIG. 4C, so as to cover the entire surface of the electron supply layer 25, the first passivation film 56 is defined, e.g., by the CVD (chemical vapor deposition) method.

Next, as illustrated in FIG. 4D, the plate film 6 is defined, e.g., by a method of sputtering or vapor deposition on the first passivation film 56. Then, for example, the plate film 6 is selectively removed by dry etching. This allows the plate film 6 to be defined between the formation region of the source electrode 5 and the formation region of the drain electrode 3.

Next, as illustrated in FIG. 4E, so as to cover the entire surface of the first passivation film 56, the second passivation film 57 is defined, e.g., by the CVD (chemical vapor deposition) method.

Next, as illustrated in FIG. 4F, for example, the second passivation film 57, the first passivation film 56, and the underlayer film 28 are selectively removed by dry etching. This allows the source contact hole 37 and the drain contact hole 38 to be defined at the same time.

Next, as illustrated in FIG. 4G, a conductive film is defined on the second passivation film 57, e.g., by a method of sputtering or vapor deposition, and the conductive film is selectively removed, e.g., by dry etching. This allows the second source field plate 59, the source electrode 5, and the drain electrode 3 to be defined at the same time.

Next, as illustrated in FIG. 4H, so as to cover the entire surface of the second passivation film 57, the third passivation film 58 is defined, e.g., by the CVD (chemical vapor deposition) method.

Next, as illustrated in FIG. 4I, the passivation film 29 and the plate film 6 are etched from an etching area including an area opposing the plate film 6, thereby defining the gate opening 32. This allows the plate film 6 to be separated into the first source field plate 8 toward the drain side and the floating plate 9 toward the source side in a self-consistent fashion relative to the gate opening 32. Thus, at this stage, the first source field plate 8 and the floating plate 9 are to be exposed to the side of the gate opening 32.

Next, as illustrated in FIG. 4J, so as to cover the entire surface of the passivation film 29, an insulating film 47 is defined, e.g., by the CVD (chemical vapor deposition) method. The process of defining the insulating film 47 may include a step of defining a stacked layer structure of insulating film by including a sub-step of defining a lower layer film 48 in contact with the passivation film 29 and a sub-step of defining an upper layer film 49 that defines the outermost surface of the insulating film 47. The layered structure may be formed of two layers or three or more layers. For example, the lower layer film 48 may be formed of $SiO_2$ film, and the upper layer film 49 may be formed of $Al_2O_3$ film.

Defining both the passivation film 29 and the lower layer film 48 of $SiO_2$ film enhances the adhesion of the insulating film 47 (the lower layer film 48) to the passivation film 29. Thus, in the steps that follow, it is possible to prevent the film of the side wall 35 from being peeled off.

Next, as illustrated in FIG. 4K, a portion of the insulating film 47 on the passivation film 29 is selectively removed, e.g., by etch back so as to define the side wall 35 on the side of the gate opening 32. Employing the $A_2O_3$ film as the upper layer film 49 may cause part of the $Al_2O_3$ film, which is difficult to etch, to remain after etch back as a protrusion 50 that is protruded upwardly from the gate opening 32.

Next, as illustrated in FIG. 4L, the underlayer film 28 on the bottom of the gate opening 32 is selectively removed, e.g., by dry etching. This causes the electron supply layer 25 of the group-III nitride semiconductor layered structure 2 to be exposed to the bottom of the gate opening 32. When the underlayer film 28 is of SiN film and the upper layer film 49 is of $Al_2O_3$ film, the etching selectivity of the upper layer film 49 may be reduced for an etchant for the underlayer film 28 (e.g., a $CF_4$ gas). Thus, when etching the underlayer film 28, the lower layer film 48 can be protected by the upper layer film 49 and the side wall 35 (the lower layer film 48) is prevented from being etched together with the underlayer film 28 and thereby reduced in thickness. Thus, even after the underlayer 28 is etched, it is possible to maintain the side wall 35 that has a thickness near the design value.

Next, as illustrated in FIG. 4M, the surface of the side wall 35 is selectively removed, e.g., by dry etching. In this preferred embodiment, the upper layer film 49 that defines the outermost surface is selectively removed, thereby causing the lower layer film 48 to remain as the side wall 35. When the upper layer film 49 is of $Al_2O_3$ film, for example, a $BCl_3$ gas may be employed as an etchant. Subsequently, the portion of the electron supply layer 25 exposed to the gate opening 32 is selectively oxidized, thereby causing part of the electron supply layer 25 to be turned to the oxide film 27.

Next, as illustrated in FIG. 4N, so as to cover the entire surface of the passivation film 29, the gate insulating film 33 is defined, e.g., by the CVD (chemical vapor deposition) method.

Next, as illustrated in FIG. 4O, a conductive film is defined on the passivation film 29 (the third passivation film 58), e.g., by a method of sputtering or vapor deposition. The conductive film is embedded in the gate opening 32 and also, defined on the surface of the passivation film 29. Then, for example, the conductive film is selectively removed by dry etching. This allows the gate electrode 4 and the third source field plate 60 to be defined at the same time.

Next, as illustrated in FIG. 4P, so as to cover the entire surface of the passivation film 29, the first interlayer insulating film 67 is defined, e.g., by the CVD (chemical vapor deposition) method.

Next, as illustrated in FIG. 4Q, the first interlayer insulating film 67 is selectively removed, e.g., by dry etching. In this manner, the contact hole 69 is defined.

Next, as illustrated in FIG. 4R, the first source conductor wiring 70 is defined on the first interlayer insulating film 67, e.g., by a method of sputtering or vapor deposition.

Subsequently, for example, the second interlayer insulating film 68, the second source conductor wiring 72, and the surface protective film 75 are defined, thereby providing the semiconductor device 1.

In the foregoing, the semiconductor device 1 is provided with a heterojunction by defining the electron supply layer 25 on the electron traveling layer 24 having a different Al composition, as described above. In this manner, the two-dimensional electron gas 26 is defined in the electron traveling layer 24 in the vicinity of the interface between the electron traveling layer 24 and the electron supply layer 25, thus defining an HEMT that employs the two-dimensional electron gas 26 as a channel. The gate electrode 4 opposes the electron traveling layer 24 with the stacked layer film of the oxide film 27 and the gate insulating film 33 sandwiched between the gate electrode 4 and the electron traveling layer 24, and there exists no electron supply layer 25 immediately below the gate electrode 4. Thus, immediately below the gate electrode 4, no two-dimensional electron gas 26 that is caused by polarization due to lattice mismatch between the electron supply layer 25 and the electron traveling layer 24 is defined. Therefore, when no bias is applied to the gate electrode 4 (at the time of zero bias), the channel by the two-dimensional electron gas 26 is interrupted immediately below the gate electrode 4. In this manner, a normally OFF type HEMT is achieved. Applying an appropriate ON voltage (e.g., 5 V) to the gate electrode 4 causes a channel to be induced in the electron traveling layer 24 immediately below the gate electrode 4 and connected with the two-dimensional electron gas 26 on both sides of the gate electrode 4. This provides conduction between the source and the drain.

For service purposes, for example, a predetermined voltage (e.g., 200 V to 400 V) that makes the drain electrode 3 side positive is applied between the source electrode 5 and the drain electrode 3. In this state, an OFF voltage (0 V) or ON voltage (5 V) is applied to the gate electrode 4 with the source electrode 5 at a reference potential (0 V).

The interface between the oxide film 27 and the electron traveling layer 24 continues to the interface between the electron supply layer 25 and the electron traveling layer 24, and the state of the interface of the electron traveling layer 24 immediately below the gate electrode 4 is equal to the state of the interface between the electron supply layer 25 and the electron traveling layer 24. Thus, the electron mobility of the electron traveling layer 24 immediately below the gate electrode 4 is kept at a high level. In this manner, this preferred embodiment provides a nitride semiconductor device having the normally OFF type HEMT structure.

On the other hand, an electric field tends to concentrate on the drain side end of the first source field plate 8 between the gate and the drain when the semiconductor device 1 is in an OFF state. However, according to the aforementioned arrangement, in an area closer to the drain electrode 3 side than the first source field plate 8, the second source field plate 59 electrically connected to the source electrode 5 is embedded in the passivation film 29. That is, the second source field plate 59 does not overlap an area above the gate electrode 4, but is disposed at a position below the top of the gate electrode 4 on the side of the gate electrode 4. This makes it possible to alleviate the strength of electric field concentration between the gate and the drain. As a result, it is possible to provide the semiconductor device 1 that is capable of improving the withstand voltage and the leakage property.

The aforementioned effects can be explained, for example, by the simulation shown below. The structure that was set for the simulation is that described in the aforementioned preferred embodiment in general. However, no consideration is given to the arrangement illustrated in FIG. 3 where the ends of the source field plates 8, 59, and 60 overlap each other in the thickness direction of the passivation film 29.

(1) Improvement of Withstand Voltage Property

First, the breakdown voltages were compared between an arrangement having only the first source field plate 8 and an arrangement having the second source field plate 59 (both having no third source field plate 60). As a result, the results shown in FIG. 5 were obtained.

Figure 5:
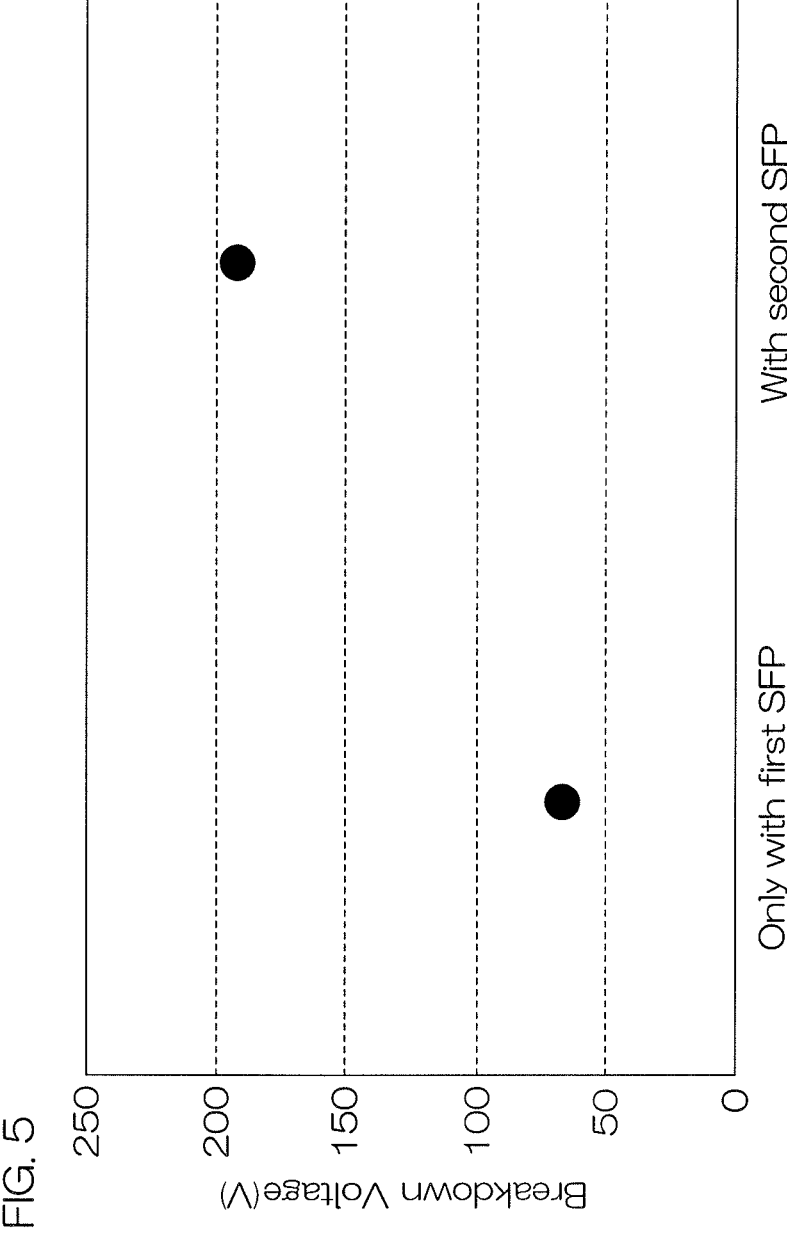
FIG. 5 is a view showing the relationship between the number of field plates and a breakdown voltage.

As shown in FIG. 5, the results show that inserting the second source field plate 59 significantly improves the withstand voltage property.

(2) Effects Resulting from Change in Film Type

Next, it was verified how the electric field strengths on the end of the gate electrode 4 toward the drain side, on the end 62 of the first source field plate 8 toward the drain side, and on the end 64 of the second source field plate 59 toward the drain side changed depending on the type of the first passivation film 56. Note that the concentration of the two-dimensional electron gas was $1 \times 10^{13}$ $cm^{-2}$, the thickness of the first passivation film 56 was 40 nm, Vg=0 V, and Vd=100 V. The results are shown in Table 1. Table 1 shows that defining the first passivation film 56 of SiN weakened the electric field strengths on the end of the gate electrode 4 toward the drain side and the end 62 of the first source field plate 8 toward the drain side.

TABLE 1

| Type of first passivation film | Gate end (MV/cm) | First SFP end (MV/cm) | Second SFP end (MV/cm) |
|---|---|---|---|
| SiO$_2$ | 4.2 | 6.6 | 6.3 |
| SiN | 3.1 | 4.7 | 6.5 |

(3) Effects by Change in Thickness

Next, it was verified how the electric field strengths on the end of the gate electrode 4 toward the drain side, on the end 62 of the first source field plate 8 toward the drain side, and on the end 64 of the second source field plate 59 toward the drain side changed depending on the thickness of the first passivation film 56. Note that the concentration of the two-dimensional electron gas was $1\times10^{13}$ cm$^{-2}$, the type of the first passivation film 56 was SiN, Vg=0 V, and Vd=100 V. The results are shown in Table 2. Table 2 shows that the change in the thickness of the first passivation film 56 results in a change of the proportion of the electric field strengths on the end of the gate electrode 4 toward the drain side and the end 62 of the first source field plate 8 toward the drain side.

TABLE 2

| Thickness of first passivation film (nm) | Gate end (MV/cm) | First SFP end (MV/cm) | Second SFP end (MV/cm) |
|---|---|---|---|
| 20 | 2.5 | 5.6 | 6.5 |
| 40 | 3 | 4.7 | 6.5 |
| 70 | 3.9 | 4.4 | 6.5 |

(4) Effects by Change in Concentration of Two-Dimensional Electron Gas

Next, it was verified how the electric field strengths on the end of the gate electrode 4 toward the drain side, on the end 62 of the first source field plate 8 toward the drain side, and on the end 64 of the second source field plate 59 toward the drain side changed depending on the concentration of the two-dimensional electron gas 26. Note that the type and the thickness of the first passivation film 56 were SiN and 40 nm, respectively, Vg=0 V, and Vd=100 V. The results are shown in Table 3. Table 3 shows that the lower the concentration of the two-dimensional electron gas 26, the weaker the electric field strength becomes.

TABLE 3

| Concentration of two-dimensional electron gas (cm$^{-2}$) | Gate end (MV/cm) | First SFP end (MV/cm) | Second SFP end (MV/cm) |
|---|---|---|---|
| $1.0 \times 10^{13}$ | 3.1 | 4.7 | 6.5 |
| $1.3 \times 10^{13}$ | 4.1 | 5.9 | 7.5 |
| $0.8 \times 10^{13}$ | 2.3 | 3.6 | 5.3 |
| $0.6 \times 10^{13}$ | 1.6 | 2.4 | 3.8 |

(5) Effects of Third Source Field Plate

Next, it was verified how the electric field strengths on the end of the gate electrode 4 toward the drain side, on the end 62 of the first source field plate 8 toward the drain side, on the end 64 of the second source field plate 59 toward the drain side, and on the end 66 of the third source field plate 60 toward the drain changed depending on the presence or absence of the third source field plate. Note that the concentration of the two-dimensional electron gas was $1\times10^{13}$ cm$^{-2}$, the type and thickness of the first passivation film 56 were SiO$_2$ and 40 nm, respectively, Vg=0 V, and Vd=100 V. The results are shown in Table 4. Table 4 shows that the insertion of the third source field plate 60 weakened the electric field strength on the end 64 of the second source field plate 59 toward the drain side.

TABLE 4

| | Gate end (MV/cm) | First SFP end (MV/cm) | Second SFP end (MV/cm) | Third SFP end (MV/cm) |
|---|---|---|---|---|
| Without third SFP | 4 | 6.7 | 6.2 | — |
| With third SFP | 4 | 6.6 | 5.8 | 2.7 |

(6) Relationship Between the Third Source Field Plate and the Thickness of the Insulating Film Immediately Thereunder Next, it was verified how the electric field strengths on the end of the gate electrode 4 toward the drain side, on the end 62 of the first source field plate 8 toward the drain side, on the end 64 of the second source field plate 59 toward the drain side, and on the end 66 of the third source field plate 60 toward the drain changed depending on the thickness of an insulating film (or SiO$_2$ in this simulation) immediately below the third source field plate. Note that the concentration of the two-dimensional electron gas was $1\times10^{13}$ cm$^{-2}$, the type and thickness of the first passivation film 56 were SiN and 40 nm, respectively, Vg=0 V, and Vd=100 V. The results are shown in Table 5. Table 5 shows that the thickness of the insulating film immediately below the third source field plate 60 is preferably about 200 nm when the balance of the electric field strength on each source field plate is taken into account.

TABLE 5

| Thickness of insulating film immediately below third SFP (nm) | Gate end (MV/cm) | First SFP end (MV/cm) | Second SFP end (MV/cm) | Third SFP end (MV/cm) |
|---|---|---|---|---|
| 0 | 3 | 3 | 0.7 | 6.8 |
| 100 | 3.1 | 4.4 | 3.1 | 6.5 |
| 200 | 3.1 | 4.6 | 5 | 5.2 |
| 300 | 3.1 | 4.7 | 5.5 | 4.4 |
| 700 | 3.1 | 4.6 | 6 | 2.7 |

In the foregoing, the preferred embodiment of the present invention was explained, the present invention can also be implemented in another mode.

Figure 6:
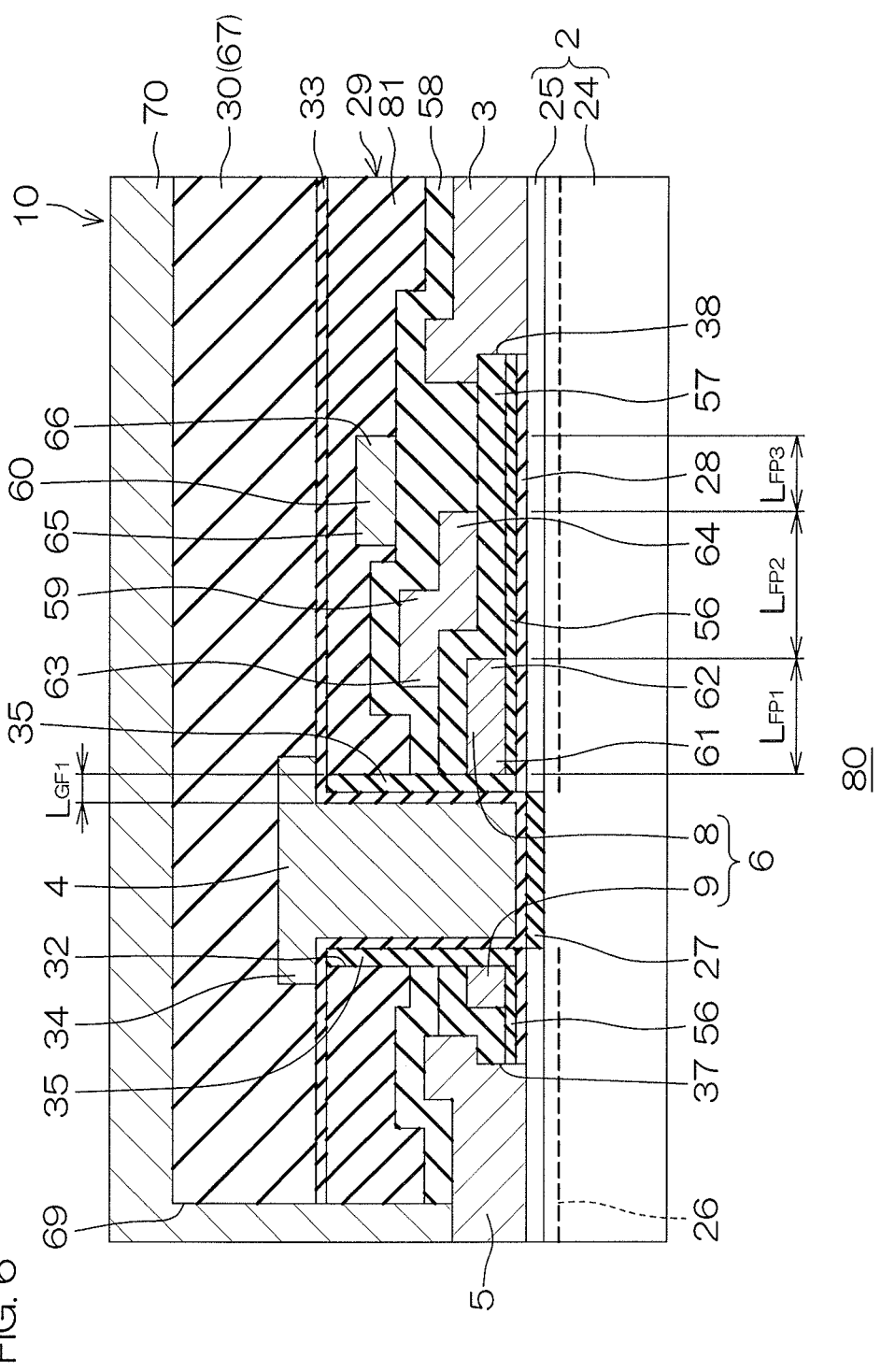
FIG. 6 is a schematic cross-sectional view illustrating a semiconductor device according to another preferred embodiment of the present invention.

For example, a semiconductor device 80 illustrated in FIG. 6 is adapted such that the third source field plate 60 is not defined on the passivation film 29 but embedded in the passivation film 29. In this case, the passivation film 29 has a fourth passivation film 81 on the third passivation film 58, while the third source field plate 60 may be sandwiched between the third passivation film 58 and the fourth passivation film 81.

Figure 7:
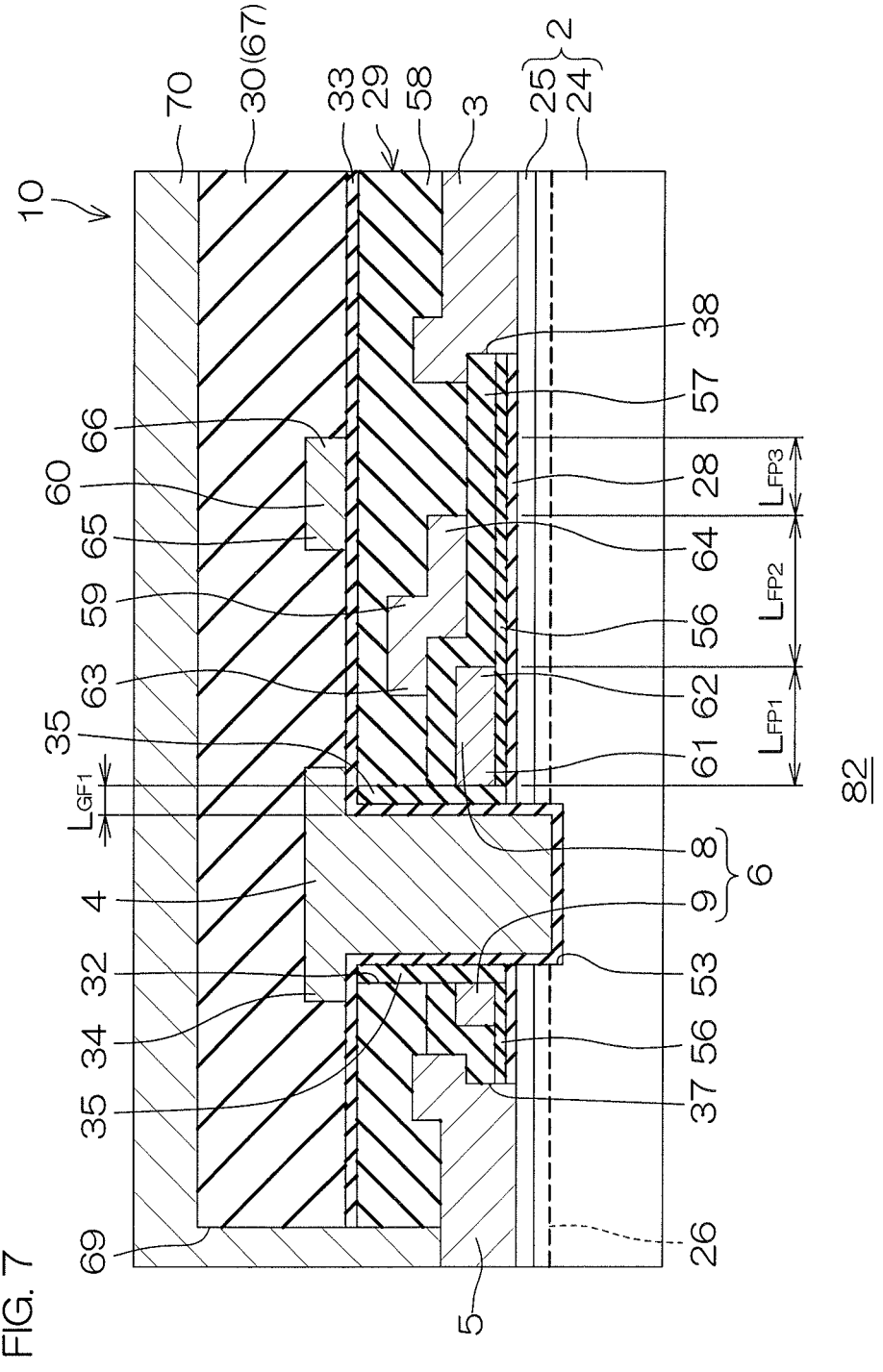
FIG. 7 is a schematic cross-sectional view illustrating a semiconductor device according to another preferred embodiment of the present invention.

Furthermore, for example, a semiconductor device 82 illustrated in FIG. 7 has a recess 53 in place of the oxide film 27 as a structure to achieve the normally OFF type HEMT. For example, the recess 53 may be defined to penetrate the electron supply layer 25 to reach the surface layer of the electron traveling layer 24 by selectively etching only the bottom of the gate opening 32. The recess 53 prevents the formation of a heterojunction between the electron traveling layer 24 and the electron supply layer 25 immediately below the gate electrode 4. In this manner, when no gate bias is applied (at the time of zero bias), no two-dimensional electron gas 26 is defined in an area immediately below the gate electrode 4. It is thus possible to achieve the normally OFF type HEMT.

Figure 8:
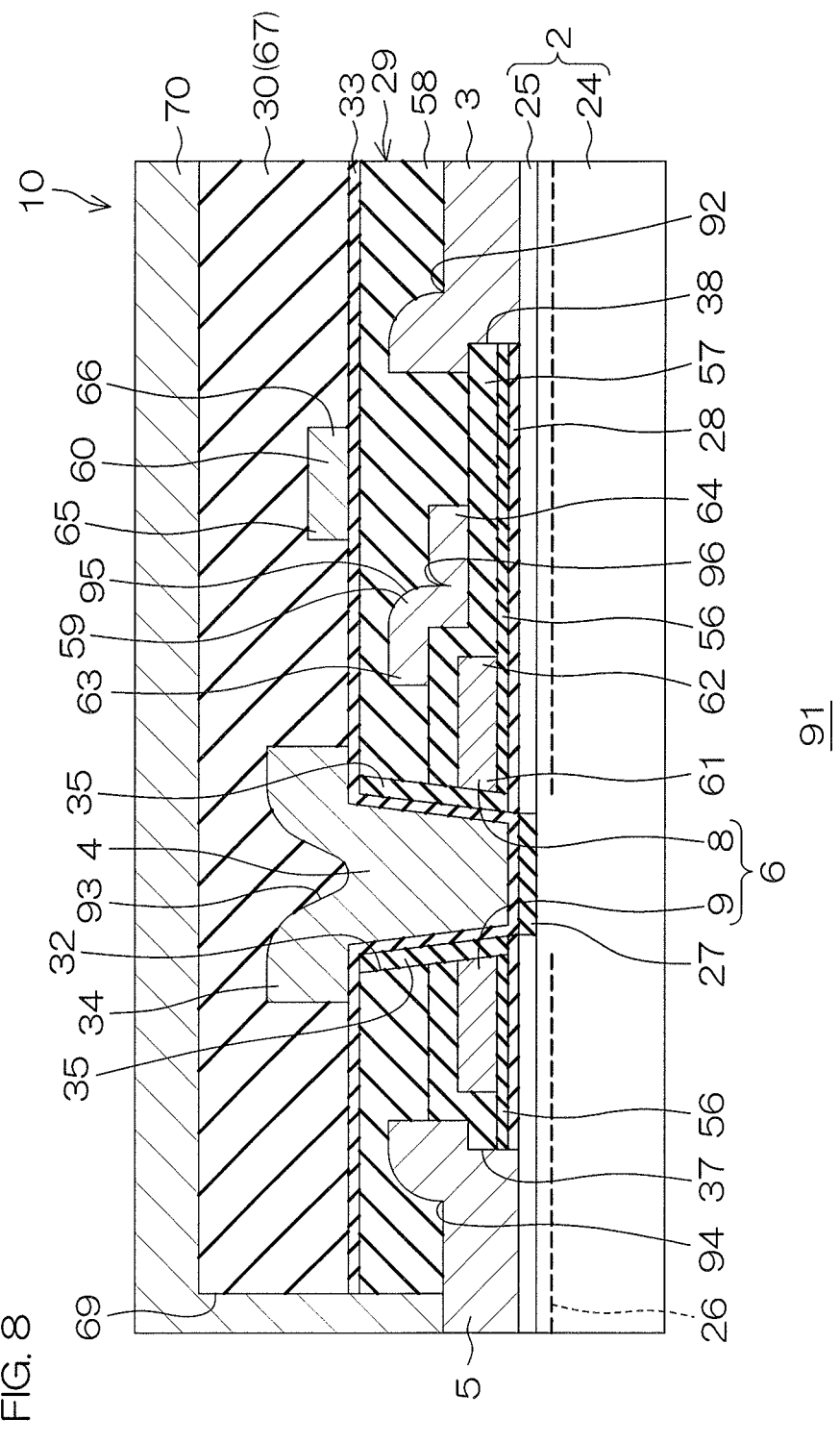
FIG. 8 is a schematic cross-sectional view illustrating a semiconductor device according to another preferred embodiment of the present invention.

Furthermore, for example, like a semiconductor device 91 illustrated in FIG. 8, the first source field plate 8 and the floating plate 9 may have mutually generally the same width when viewed in cross section. Furthermore, on the surfaces of the drain electrode 3, the gate electrode 4, the source electrode 5, and the second source field plate 59, there may be defined step portions 92, 93, 94, 95 each having a side of a curved surface. Furthermore, on the second source field plate 59 of the step portion 95, there may be defined a recess 96 that is recessed further than the step portion 95.

Furthermore, as described above, the gate opening 32 may have a constant width from the bottom to the opening end thereof, but may also have a tapered shape that is increased in width from the bottom to the opening end when viewed in cross section.

Figure 9:
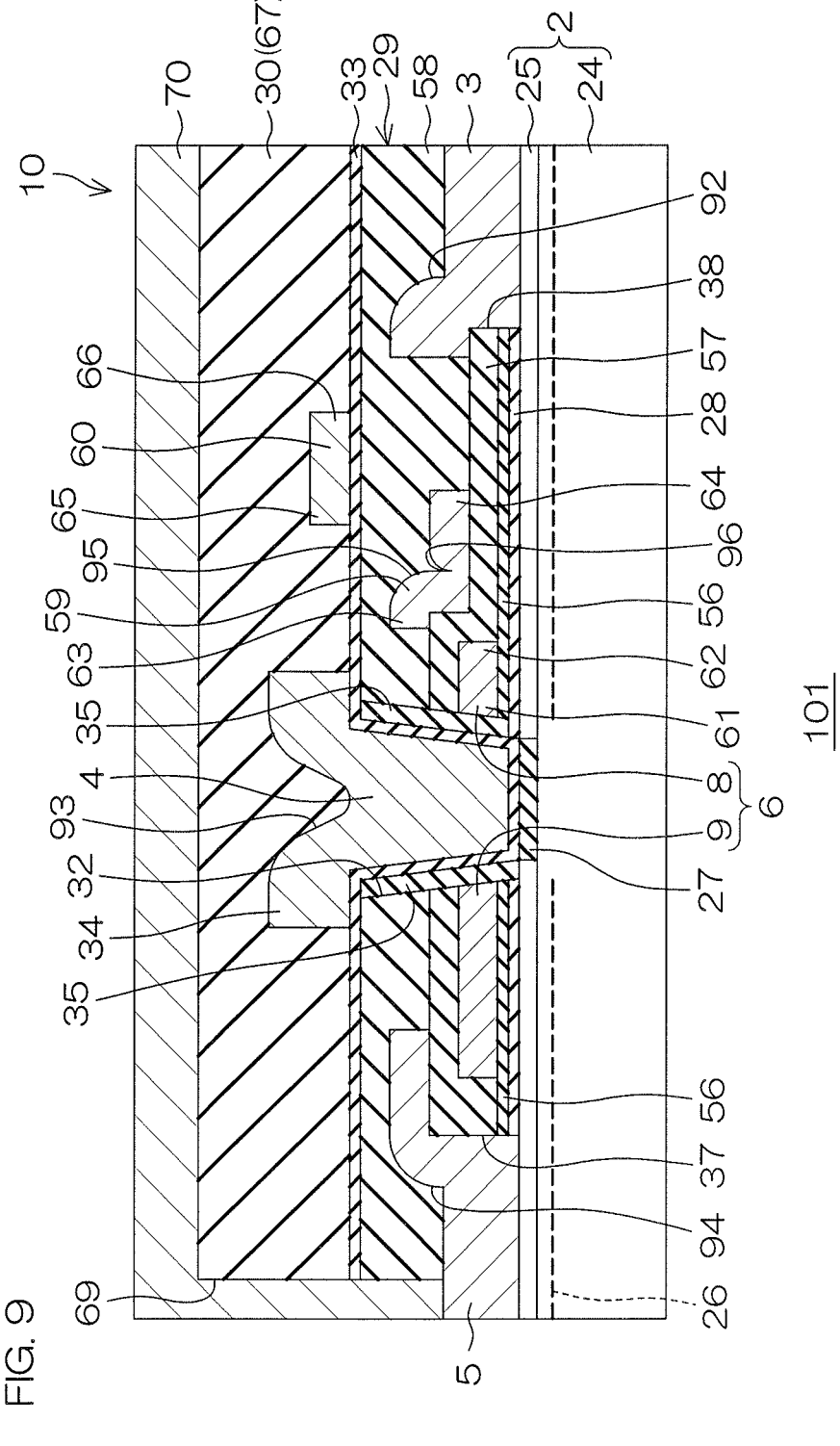
FIG. 9 is a schematic cross-sectional view illustrating a semiconductor device according to another preferred embodiment of the present invention.

Furthermore, for example, like a semiconductor device 101 illustrated in FIG. 9, the floating plate 9 may also have a greater width than the first source field plate 8 when viewed in cross section. Furthermore, the source electrode 5 may be defined to overlap the floating plate 9 with the second passivation film 57 interposed between the source electrode 5 and the floating plate 9 in the thickness direction of the passivation film 29. That is, the source electrode 5 may also have a portion that is disposed above the floating plate 9 with the second passivation film 57 sandwiched between the portion and the floating plate 9. On the other hand, the end 63 of the second source field plate 59 may not have to oppose the first source field plate 8 in the thickness direction of the passivation film 29.

Furthermore, the semiconductor device 1 may not have to include the side wall 35. In this case, it is possible to control the distance $L_{GF}$ between the gate electrode 4 and the first source field plate 8 based on only the thickness of the gate insulating film 33.

Furthermore, the semiconductor device 1 may not have to include the floating plate 9 between the source and the gate. That is, between the source and the gate and between the gate and the drain, the field plate (the first source field plate 8, the second source field plate 59, and the third source field plate 60) may be selectively provided only between the gate and the drain. For example, in an arrangement like this, the etching area may be set as an area across the inside and outside of the end of the plate film 6 at the time of etching as illustrated in FIG. 4J.

Other than specifically described above, a number of modifications of the design are possible within the scope of the appended claims.

What is claimed is:

1. A semiconductor device comprising:
a group-III nitride semiconductor layered structure that includes a heterojunction;
an insulating layer which has a gate opening that reaches the group-III nitride semiconductor layered structure and which is disposed on the group-III nitride semiconductor layered structure;
a gate insulating film that covers a bottom and a side of the gate opening;
a gate electrode defined on the gate insulating film inside the gate opening;
a source electrode and a drain electrode which are disposed to be spaced apart from the gate electrode such that the source electrode and the drain electrode sandwich the gate electrode and each of which are electrically connected to the group-III nitride semiconductor layered structure;
a first conductive layer embedded in the insulating layer between the gate electrode and the drain electrode and electrically connected to the source electrode;
a first passivation film disposed below the first conductive layer and the insulating layer;
a wiring conductive path formed in contact with the source electrode, a horizontal portion of the wiring conductive path being in parallel with the first conductive layer; and
a second conductive layer embedded in the insulating layer above the first conductive layer in a region closer to a drain electrode side than the first conductive layer and electrically connected to the source electrode, the second conductive layer having a lower-most portion positioned lower than an upper-most portion of the gate electrode in a sectional view,
wherein an interface between the first passivation film and the insulating layer is below the top surface of the drain electrode, and
wherein the second conductive layer has an end toward a gate electrode side that opposes the first conductive layer with part of the insulating layer sandwiched between the end and the first conductive layer in a thickness direction of the insulating layer.

2. A semiconductor device comprising:
a group-III nitride semiconductor layered structure that includes a heterojunction;
an insulating layer which has a gate opening that reaches the group-III nitride semiconductor layered structure and which is disposed on the group-III nitride semiconductor layered structure;
a gate insulating film that covers a bottom and a side of the gate opening;
a gate electrode defined on the gate insulating film inside the gate opening;
a source electrode and a drain electrode which are disposed to be spaced apart from the gate electrode such that the source electrode and the drain electrode sandwich the gate electrode and each of which are electrically connected to the group-III nitride semiconductor layered structure;
a first conductive layer embedded in the insulating layer between the gate electrode and the drain electrode and electrically connected to the source electrode;
a first passivation film disposed below the first conductive layer and the insulating layer;
a wiring conductive path formed in contact with the source electrode, a horizontal portion of the wiring conductive path being in parallel with the first conductive layer; and
a second conductive layer embedded in the insulating layer above the first conductive layer in a region closer to a drain electrode side than the first conductive layer and electrically connected to the source electrode, the second conductive layer having a lower-most portion positioned lower than an upper-most portion of the gate electrode in a sectional view,
wherein the drain electrode straddles an interface between the first passivation film and the insulating layer, and
wherein the second conductive layer has an end toward a gate electrode side that opposes the first conductive layer with part of the insulating layer sandwiched between the end and the first conductive layer in a thickness direction of the insulating layer.

3. The semiconductor device according to claim 1, further comprising:

a third conductive layer which is disposed above the insulating layer in a region closer to the drain electrode side than the second conductive layer and electrically connected to the source electrode.

4. The semiconductor device according to claim 2, further comprising:

a third conductive layer which is disposed above the insulating layer in a region closer to the drain electrode side than the second conductive layer and electrically connected to the source electrode, wherein the first conductive layer has a first end surface and a second end surface, the first end surface of the first conductive layer being closer to the drain electrode side than the second end surface of the first conductive layer, the third conductive layer has a first end surface and a second end surface, the first end surface of the third conductive layer being closer to the drain electrode side than the second end surface of the third conductive layer, and a distance between the first end surface of the third conductive layer and the drain electrode is shorter than a distance between the first end surface of the first conductive layer and the first end surface of the third conductive layer.

5. The semiconductor device according to claim 1, further comprising:

a third conductive layer which is embedded in the insulating layer above the second conductive layer in a region closer to the drain electrode side than the second conductive layer and electrically connected to the source electrode.

6. The semiconductor device according to claim 3, wherein the third conductive layer has an end toward the gate electrode side which opposes the second conductive layer with part of the insulating layer sandwiched between the end and the second conductive layer in the thickness direction of the insulating layer.

7. The semiconductor device according to claim 3, wherein the insulating layer immediately below the third conductive layer has a thickness of 150 nm to 250 nm.

8. The semiconductor device according to claim 1, wherein the gate electrode includes an overlap portion which is defined above the insulating layer such that the overlap portion opposes an end of the first conductive layer toward the gate electrode side with part of the insulating layer sandwiched between the overlap portion and the end of the first conductive layer in the thickness direction of the insulating layer.

9. The semiconductor device according to claim 1, further comprising:

a second conductive layer that is embedded in the insulating layer above the first conductive layer in a region closer to the drain electrode side than the first conductive layer and electrically connected to the source electrode, wherein the insulating layer includes a first insulating layer supporting the first conductive layer, a second insulating layer covering the first conductive layer and supporting the second conductive layer, and a third insulating layer covering the second conductive layer; and the first insulating layer is formed of a SiN layer.

10. The semiconductor device according to claim 9, wherein the SiN layer has a thickness of 30 nm to 80 nm.

11. The semiconductor device according to claim 1, wherein a two-dimensional electron gas defined in the heterojunction of the group-III nitride semiconductor layered structure has a concentration of $0.5 \times 10^{13}$ $cm^{-2}$ to $1.0 \times 10^{13}$ $cm^{-2}$.

12. A semiconductor device comprising:

a group-III nitride semiconductor layered structure that includes a heterojunction;

an insulating layer which has a gate opening that reaches the group-III nitride semiconductor layered structure and which is disposed on the group-III nitride semiconductor layered structure;

a gate insulating film that covers a bottom and a side of the gate opening;

a gate electrode defined on the gate insulating film inside the gate opening;

a source electrode and a drain electrode which are disposed to be spaced apart from the gate electrode such that the source electrode and the drain electrode sandwich the gate electrode and each of which are electrically connected to the group-III nitride semiconductor layered structure;

a first conductive layer embedded in the insulating layer between the gate electrode and the drain electrode and electrically connected to the source electrode;

a first passivation film disposed below the first conductive layer and the insulating layer;

a wiring conductive path formed in contact with the source electrode, a horizontal portion of the wiring conductive path being in parallel with the first conductive layer; and an insulating side wall which is disposed between the gate insulating film and the side of the gate opening, wherein an interface between the first passivation film and the insulating layer is below the top surface of the drain electrode.

13. The semiconductor device according to claim 12, wherein the side wall includes at least one type of material selected from a group consisting of $SiO_2$, SiN, and SiON.

14. The semiconductor device according to claim 1, wherein a distance $L_{GF1}$ between the gate electrode and the first conductive layer is 1 μm or less.

15. The semiconductor device according to claim 1, wherein the gate insulating film includes at least one type of material selected from a group consisting of Si, Al, and Hf as a component element.

16. The semiconductor device according to claim 1, wherein the gate electrode includes a metal electrode.

17. The semiconductor device according to claim 1, further comprising:

a second conductive layer that is embedded in the insulating layer above the first conductive layer in a region closer to the drain electrode side than the first conductive layer and electrically connected to the source electrode, wherein the group-III nitride semiconductor layered structure includes an active region which includes an element structure arranged by sandwiching the gate electrode between the source electrode and the drain electrode and a nonactive region outside the active region;

the source electrode, the first conductive layer, and the second conductive layer each include an extension to the nonactive region; and the extension of the source electrode is connected to the extensions of the first conductive layer and the second conductive layer.

18. The semiconductor device according to claim 1, wherein the group-III nitride semiconductor layered structure includes a first semiconductor layer and a second semiconductor layer on the first semiconductor layer that defines the heterojunction; and the second semiconductor layer includes an oxide film selectively defined within it by oxidizing the second semiconductor layer on the bottom of the gate opening.

19. The semiconductor device according to claim 1, wherein the group-III nitride semiconductor layered structure includes a first semiconductor layer and a second semiconductor layer on the first semiconductor layer that define the heterojunction; and the second semiconductor layer is selectively etched only on the bottom of the gate opening.

\* \* \* \* \*